(12) United States Patent
He et al.

(10) Patent No.: US 10,023,970 B2
(45) Date of Patent: Jul. 17, 2018

(54) DYNAMIC CURRENT DISTRIBUTION CONTROL APPARATUS AND METHOD FOR WAFER ELECTROPLATING

(71) Applicant: Novellus Systems, Inc., Fremont, CA (US)

(72) Inventors: Zhian He, Lake Oswego, OR (US); David W. Porter, Sherwood, OR (US); Jonathan D. Reid, Sherwood, OR (US); Frederick D. Wilmot, Gladstone, OR (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 15/787,580

(22) Filed: Oct. 18, 2017

(65) Prior Publication Data

US 2018/0057955 A1    Mar. 1, 2018

Related U.S. Application Data

(60) Division of application No. 13/687,937, filed on Nov. 28, 2012, now Pat. No. 9,822,461, which is a
(Continued)

(51) Int. Cl.
*C25D 7/12* (2006.01)
*C25D 21/12* (2006.01)
(Continued)

(52) U.S. Cl.
CPC .............. *C25D 21/12* (2013.01); *C25D 7/123* (2013.01); *C25D 17/001* (2013.01);
(Continued)

(58) Field of Classification Search
CPC ...... C25D 7/123; C25D 17/001; C25D 17/008
See application file for complete search history.

(56) References Cited

U.S. PATENT DOCUMENTS 3,880,725 A    4/1975    Van Raalte et al.
4,304,641 A    12/1981    Grandia et al.
(Continued)

FOREIGN PATENT DOCUMENTS

CA    1 236 627      7/1986
CN    1531028 A      9/2004
(Continued)

OTHER PUBLICATIONS

U.S. Office Action, dated Feb. 10, 2017, issued in U.S. Appl. No. 14/067,616.
(Continued)

*Primary Examiner* — Bryan D. Ripa
(74) *Attorney, Agent, or Firm* — Weaver Austin Villeneuve & Sampson LLP

(57) ABSTRACT

Methods, systems, and apparatus for plating a metal onto a work piece are described. In one aspect, an apparatus includes a plating chamber, a substrate holder, an anode chamber housing an anode, an ionically resistive ionically permeable element positioned between a substrate and the anode chamber during electroplating, an auxiliary cathode located between the anode and the ionically resistive ionically permeable element, and an insulating shield with an opening in its central region. The insulating shield may be movable with respect to the ionically resistive ionically permeable element to vary a distance between the shield and the ionically resistive ionically permeable element during electroplating.

17 Claims, 13 Drawing Sheets

Related U.S. Application Data continuation-in-part of application No. 13/306,527, filed on Nov. 29, 2011, now Pat. No. 9,045,840, and a continuation-in-part of application No. 12/481,503, filed on Jun. 9, 2009, now Pat. No. 8,475,636, which is a continuation-in-part of application No. 12/291,356, filed on Nov. 7, 2008, now Pat. No. 8,308,931, which is a continuation-in-part of application No. 11/506,054, filed on Aug. 16, 2006, now Pat. No. 7,854,828.

(51) Int. Cl.
 C25D 17/10 (2006.01)
 C25D 17/06 (2006.01)
 C25D 17/00 (2006.01)
 H01L 21/02 (2006.01)

(52) U.S. Cl.
 CPC ......... *C25D 17/002* (2013.01); *C25D 17/007* (2013.01); *C25D 17/06* (2013.01); *C25D 17/10* (2013.01); *H01L 21/02697* (2013.01)

(56) References Cited

U.S. PATENT DOCUMENTS

| | | | |
|---|---|---|---|
| 4,696,729 A | 9/1987 | Santini | |
| 5,078,852 A | 1/1992 | Yee et al. | |
| 5,169,684 A | 12/1992 | Takagi | |
| 5,312,352 A | 5/1994 | Leschinsky et al. | |
| 5,312,532 A | 5/1994 | Andricacos et al. | |
| 5,620,581 A | 4/1997 | Ang | |
| 5,723,028 A | 3/1998 | Poris | |
| 5,774,019 A | 6/1998 | Koyama et al. | |
| 6,004,440 A | 12/1999 | Hanson et al. | |
| 6,027,631 A | 2/2000 | Broadbent | |
| 6,071,388 A | 6/2000 | Uzoh | |
| 6,074,544 A | 6/2000 | Reid et al. | |
| 6,099,702 A | 8/2000 | Reid et al. | |
| 6,106,687 A | 8/2000 | Edelstein | |
| 6,110,346 A | 8/2000 | Reid et al. | |
| 6,126,798 A * | 10/2000 | Reid ............... C25D 17/10 204/199 | |
| 6,132,587 A | 10/2000 | Jorne et al. | |
| 6,132,805 A | 10/2000 | Moslehi | |
| 6,156,167 A | 12/2000 | Patton et al. | |
| 6,162,344 A | 12/2000 | Reid et al. | |
| 6,168,693 B1 | 1/2001 | Uzoh et al. | |
| 6,174,425 B1 | 1/2001 | Simpson et al. | |
| 6,179,983 B1 | 1/2001 | Reid et al. | |
| 6,193,860 B1 | 2/2001 | Weling | |
| 6,228,231 B1 | 5/2001 | Uzoh | |
| 6,261,433 B1 | 7/2001 | Landau | |
| 6,322,674 B1 | 11/2001 | Berner et al. | |
| 6,391,166 B1 | 5/2002 | Wang | |
| 6,391,168 B1 | 5/2002 | Ueno | |
| 6,402,923 B1 | 6/2002 | Mayer et al. | |
| 6,425,991 B1 | 7/2002 | Tran et al. | |
| 6,497,801 B1 | 12/2002 | Woodruff et al. | |
| 6,527,920 B1 | 3/2003 | Mayer et al. | |
| 6,551,483 B1 | 4/2003 | Mayer et al. | |
| 6,569,299 B1 | 5/2003 | Reid et al. | |
| 6,599,412 B1 | 7/2003 | Graham et al. | |
| 6,627,051 B2 | 9/2003 | Berner et al. | |
| 6,627,052 B2 | 9/2003 | Fluegel et al. | |
| 6,632,335 B2 | 10/2003 | Kunisawa et al. | |
| 6,716,334 B1 | 4/2004 | Reid et al. | |
| 6,755,954 B2 | 6/2004 | Mayer et al. | |
| 6,773,571 B1 | 8/2004 | Mayer et al. | |
| 6,800,187 B1 | 10/2004 | Reid et al. | |
| 6,843,894 B2 | 1/2005 | Berner et al. | |
| 6,919,010 B1 | 7/2005 | Mayer et al. | |
| 6,988,932 B2 | 1/2006 | Ashjaee et al. | |
| 7,288,177 B2 | 10/2007 | Barrese et al. | |
| 7,323,094 B2 | 1/2008 | Simpson et al. | |
| 7,383,521 B2 | 6/2008 | Smith et al. | |
| 7,622,024 B1 | 11/2009 | Mayer et al. | |
| 7,682,498 B1 | 3/2010 | Mayer et al. | |
| 7,737,035 B1 | 6/2010 | Lind et al. | |
| 7,837,841 B2 | 11/2010 | Chen et al. | |
| 7,854,828 B2 | 12/2010 | Reid et al. | |
| 7,967,969 B2 | 6/2011 | Mayer et al. | |
| 8,262,871 B1 | 9/2012 | Mayer et al. | |
| 8,308,931 B2 | 11/2012 | Reid et al. | |
| 8,475,636 B2 | 7/2013 | Mayer et al. | |
| 8,475,637 B2 | 7/2013 | Mayer et al. | |
| 8,475,644 B2 | 7/2013 | Mayer et al. | |
| 8,603,305 B2 | 12/2013 | Rash et al. | |
| 8,795,480 B2 | 8/2014 | Mayer et al. | |
| 8,858,774 B2 | 10/2014 | Mayer et al. | |
| 9,260,793 B2 | 2/2016 | Mayer et al. | |
| 9,309,604 B2 | 4/2016 | Mayer et al. | |
| 9,567,685 B2 | 2/2017 | Kagajawala et al. | |
| 9,752,248 B2 | 9/2017 | Kagajawala et al. | |
| 9,909,228 B2 | 3/2018 | He | |
| 2002/0017456 A1 | 2/2002 | Graham et al. | |
| 2002/0020627 A1 | 2/2002 | Kunisawa et al. | |
| 2002/0046952 A1 | 4/2002 | Graham et al. | |
| 2002/0119671 A1 | 8/2002 | Lee | |
| 2002/0125141 A1 | 9/2002 | Wilson et al. | |
| 2003/0038035 A1 | 2/2003 | Wilson et al. | |
| 2003/0079995 A1* | 5/2003 | Contolini ............. C25D 17/008 205/118 | |
| 2003/0168340 A1 | 9/2003 | Kaja et al. | |
| 2003/0201166 A1 | 10/2003 | Zheng et al. | |
| 2004/0026257 A1* | 2/2004 | Gonzalez, Jr. ...... H01L 21/2885 205/157 | |
| 2004/0084316 A1* | 5/2004 | Muranaka ................ C25D 5/04 205/84 | |
| 2004/0094427 A1 | 5/2004 | Economikos et al. | |
| 2004/0149584 A1 | 8/2004 | Nagai et al. | |
| 2005/0109627 A1 | 5/2005 | Sun et al. | |
| 2005/0145499 A1 | 7/2005 | Kovarsky et al. | |
| 2005/0164498 A1 | 7/2005 | Ide et al. | |
| 2006/0201814 A1 | 9/2006 | Hafezi et al. | |
| 2006/0243598 A1 | 11/2006 | Singh et al. | |
| 2007/0029193 A1 | 2/2007 | Brcka | |
| 2008/0179180 A1 | 7/2008 | McHugh et al. | |
| 2008/0223724 A1* | 9/2008 | Chen .................. H01L 21/2885 205/96 | |
| 2010/0032303 A1 | 2/2010 | Reid et al. | |
| 2010/0032304 A1 | 2/2010 | Mayer et al. | |
| 2010/0032310 A1* | 2/2010 | Reid ..................... C25D 21/12 205/261 | |
| 2010/0044236 A1* | 2/2010 | Mayer ................ C23C 18/1601 205/80 | |
| 2010/0116672 A1 | 5/2010 | Mayer et al. | |
| 2012/0000786 A1 | 1/2012 | Mayer et al. | |
| 2012/0061246 A1 | 3/2012 | Feng et al. | |
| 2012/0258408 A1 | 10/2012 | Mayer et al. | |
| 2013/0137242 A1 | 5/2013 | He et al. | |
| 2013/0313123 A1 | 11/2013 | Abraham et al. | |
| 2013/0327650 A1 | 12/2013 | Mayer et al. | |
| 2014/0144781 A1 | 5/2014 | He | |
| 2014/0231245 A1 | 8/2014 | Sandmann et al. | |
| 2015/0060291 A1 | 3/2015 | Mayer et al. | |
| 2016/0115611 A1 | 4/2016 | Mayer et al. | |
| 2016/0177466 A1 | 6/2016 | Kagajawala et al. | |
| 2016/0215408 A1 | 7/2016 | Kagajawala et al. | |
| 2018/0057955 A1 | 3/2018 | He et al. | |
| 2018/0142374 A1 | 5/2018 | He | |

FOREIGN PATENT DOCUMENTS

| | | |
|---|---|---|
| CN | 1624207 A | 6/2005 |
| CN | 1705774 A | 12/2005 |
| CN | 101056718 A | 10/2007 |
| CN | 100487855 C | 5/2009 |
| CN | 101736376 A | 6/2010 |
| CN | 102459717 B | 12/2014 |
| EP | 1 179 617 A1 | 2/2002 |
| JP | 2003-268591 | 9/2003 |
| KR | 10-0707121 | 4/2007 |

(56) References Cited

FOREIGN PATENT DOCUMENTS

| TW | 223678 | 11/2004 |
|---|---|---|
| TW | 201107536 A | 3/2011 |
| WO | WO 99/14401 | 3/1999 |
| WO | WO 99/64647 | 12/1999 |
| WO | WO2005/043593 | 5/2005 |
| WO | WO2010/144330 | 12/2010 |

OTHER PUBLICATIONS

U.S. Final Office Action, dated Jul. 7, 2017, issued in U.S. Appl. No. 14/067,616.
U.S. Office Action, dated Nov. 9, 2016, issued in U.S. Appl. No. 14/578,068.
U.S. Notice of Allowance, dated May 3, 2017, issued in U.S. Appl. No. 14/578,068.
U.S. Notice of Allowance [Corrected Notice of Allowability], dated Jun. 21, 2017, issued in U.S. Appl. No. 14/578,068.
U.S. Office Action, dated Jun. 16, 2016, issued in U.S. Appl. No. 14/602,910.
U.S. Notice of Allowance, dated Oct. 6, 2016, issued in U.S. Appl. No. 14/602,910.
U.S. Office Action, dated May 26, 2010, issued in U.S. Appl. No. 11/506,054.
U.S. Notice of Allowance, dated Aug. 13, 2010, issued in U.S. Appl. No. 11/506,054.
U.S. Office Action, dated Sep. 19, 2011, issued in U.S. Appl. No. 12/291,356.
U.S. Final Office Action, dated Feb. 27, 2012, issued in U.S. Appl. No. 12/291,356.
U.S. Notice of Allowance, dated Jul. 27, 2012, issued in U.S. Appl. No. 12/291,356.
U.S. Office Action, dated Jun. 24, 2011, issued in U.S. Appl. No. 12/481,503.
U.S. Final Office Action, dated Mar. 1, 2012, issued in U.S. Appl. No. 12/481,503.
U.S. Office Action, dated Jul. 9, 2012, issued in U.S. Appl. No. 12/481,503.
U.S. Final Office Action, dated Dec. 19, 2012, issued in U.S. Appl. No. 12/481,503.
U.S. Notice of Allowance dated Mar. 1, 2013 issued in U.S. Appl. No. 12/481,503.
U.S. Office Action, dated Jun. 24, 2011, issued in U.S. Appl. No. 12/606,030.
U.S. Final Office Action, dated Mar. 1, 2012, issued in U.S. Appl. No. 12/606,030.
U.S. Office Action, dated Jun. 28, 2012, issued in U.S. Appl. No. 12/606,030.
U.S. Office Action, dated Jul. 13, 2012, issued in U.S. Appl. No. 12/606,030.
U.S. Final Office Action, dated Dec. 17, 2012, issued in U.S. Appl. No. 12/606,030.
U.S. Notice of Allowance dated Mar. 1, 2013 issued in U.S. Appl. No. 12/606,030.
U.S. Office Action, dated Jul. 29, 2015, issued in U.S. Appl. No. 13/907,265.
U.S. Notice of Allowance, dated Dec. 30, 2015, issued in U.S. Appl. No. 13/907,265.
U.S. Office Action, dated Feb. 25, 2014, issued in U.S. Appl. No. 13/438,443.
U.S. Notice of Allowance, dated Jun. 11, 2014, issued in U.S. Appl. No. 13/438,443.
U.S. Notice of Allowance, dated Oct. 2, 2015, issued in U.S. Appl. No. 14/483,942.
U.S. Notice of Allowance [Corrected Notice of Allowability], dated Nov. 10, 2015, issued in U.S. Appl. No. 14/483,942.
U.S. Notice of Allowance [Corrected Notice of Allowability], dated Jan. 20, 2016, issued in U.S. Appl. No. 14/483,942.
U.S. Office Action, dated Oct. 3, 2017, issued in U.S. Appl. No. 14/987,170.
U.S. Office Action, dated Jan. 15, 2016, issued in U.S. Appl. No. 13/687,937.
U.S. Final Office Action, dated May 1, 2017, issued in U.S. Appl. No. 13/687,937.
U.S. Notice of Allowance, dated Aug. 1, 2017, issued in U.S. Appl. No. 13/687,937.
Taiwan Office Action dated Feb. 18, 2017 issued in Application No. TW 102142332.
Chinese First Office Action dated Jul. 4, 2017 issued in Application No. CN 201610027064.X.
Chinese First Office Action dated May 15, 2013 issued in Application No. CN 200910209697.2.
Chinese Second Office Action dated Dec. 10, 2013 issued in Application No. CN 200910209697.2.
PCT International Search Report and Written Opinion, dated Jan. 12, 2011, issued in PCT/US2010/037520.
PCT International Preliminary Report on Patentability and Written Opinion, dated Dec. 22, 2011, issued in PCT/US2010/037520.
Chinese First Office Action dated Nov. 6, 2013 issued in Application No. CN 201080032109.3.
Chinese Second Office Action dated Jun. 10, 2014 issued in Application No. CN 201080032109.3.
Korean First Office Action dated Jun. 23, 2016 issued in Application No. KR 10-2012-7000614.
Taiwan Office Action dated Jul. 31, 2014 issued in Application No. TW 099118603.
Chinese First Office Action dated Oct. 13, 2015 issued in Application No. CN 201210098129.1.
Chinese Second Office Action dated Jun. 6, 2016 issued in Application No. CN 201210098129.1.
Chinese Third Office Action dated Nov. 18, 2016 issued in Application No. CN 201210098129.1.
Chinese Fourth Office Action dated May 31, 2017 issued in Application No. CN 201210098129.1.
Chinese First Office Action dated Mar. 31, 2017 issued in Application No. CN 201510556374.6.
Taiwan Office Action dated Nov. 10, 2015 issued in Application No. TW 101111926.
Taiwan Office Action dated Aug. 2, 2016 issued in Application No. TW 101144354.
"Release of Sabre™ electrofill tool with HRVA by Novellus Systems, Inc." no earlier than Aug. 2005. (3 pages).
U.S. Notice of Allowance dated Mar. 14, 2018 issued in U.S. Appl. No. 14/987,170.
Taiwan Notice of Allowance dated Apr. 3, 2018 issued in Application No. TW 102142332.
U.S. Appl. No. 15/873,660, filed Jan. 17, 2018, He.
Korean First Office Action dated Apr. 10, 2018 issued in Application No. KR 10-2012-0035111.

* cited by examiner

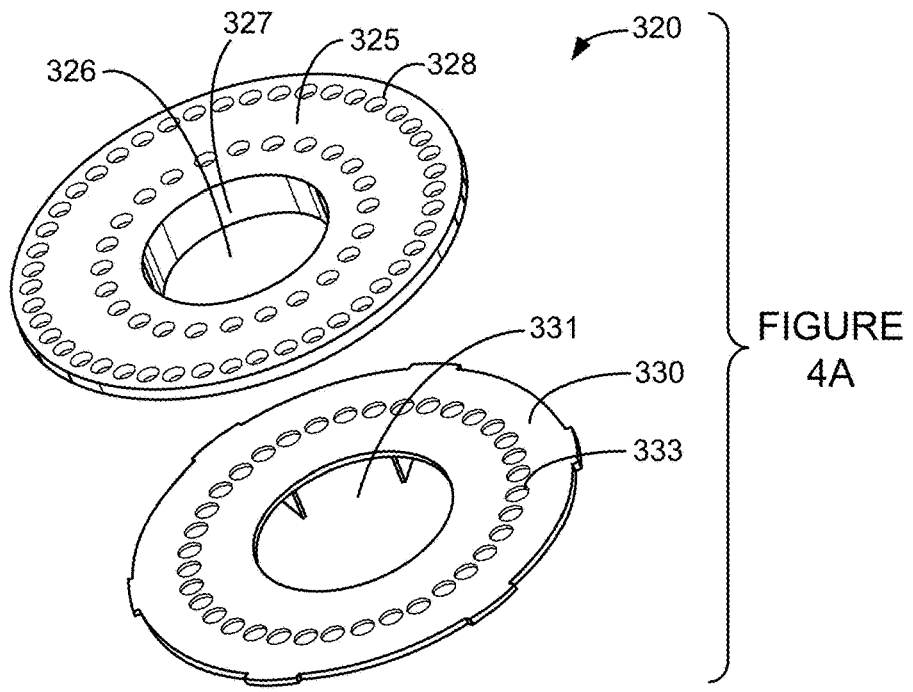
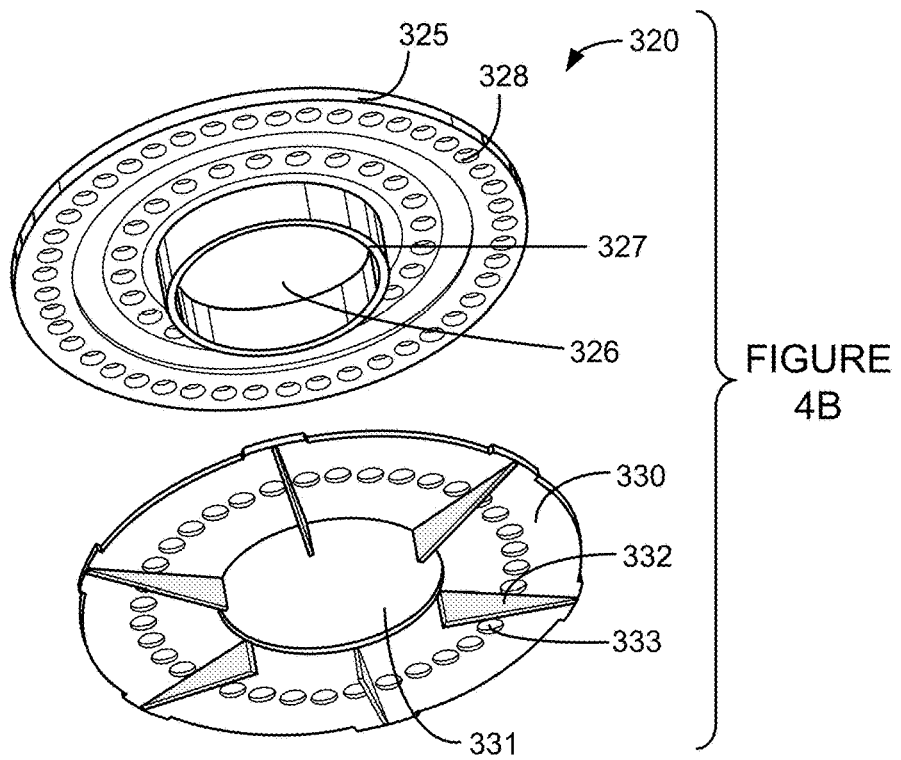

DYNAMIC CURRENT DISTRIBUTION CONTROL APPARATUS AND METHOD FOR WAFER ELECTROPLATING

CROSS-REFERENCE TO RELATED APPLICATIONS

This application is a divisional of U.S. patent application Ser. No. 13/687,937, titled "DYNAMIC CURRENT DISTRIBUTION CONTROL APPARATUS AND METHOD FOR WAFER ELECTROPLATING," filed Nov. 28, 2012, which is a continuation-in-part of U.S. patent application Ser. No. 13/306,527 (issued as U.S. Pat. No. 9,045,840), titled "DYNAMIC CURRENT DISTRIBUTION CONTROL APPARATUS AND METHOD FOR WAFER ELECTROPLATING," filed Nov. 29, 2011. U.S. patent application Ser. No. 13/687,937 is also a continuation-in-part of U.S. patent Ser. No. 12/481,503 (Issued as U.S. Pat. No. 8,475,636), titled "METHOD AND APPARATUS FOR ELECTROPLATING," filed Jun. 9, 2009, which is a continuation-in-part of U.S. patent Ser. No. 12/291,356 (Issued as U.S. Pat. No. 8,308,931), titled "METHOD AND APPARATUS FOR ELECTROPLATING," filed Nov. 7, 2008, which is a continuation-in-part of Ser. No. 11/506,054 (issued as U.S. Pat. No. 7,854,828), titled "METHOD AND APPARATUS FOR ELECTROPLATING INCLUDING REMOTELY POSITIONED SECOND CATHODE," filed Aug. 16, 2006, each of which is herein incorporated by reference in its entirety and for all purposes.

BACKGROUND

One process step used in copper damascene processing for the fabrication of integrated circuits is the formation of a "seed-" or "strike-" layer, which is then used as a base layer onto which copper is electroplated (electrofill). The seed layer carries the electrical plating current from the edge region of the wafer substrate (where electrical contact is made) to all trench and via structures located across the wafer substrate surface. The seed film is typically a thin conductive copper layer. It is separated from an insulating silicon dioxide or other dielectric by a barrier layer. The use of thin seed layers (which may also act simultaneously as copper diffusion barrier layers) which are either alloys of copper or other metals, such as ruthenium or tantalum, has also been investigated. The seed layer deposition process desirably yields a layer which has good overall adhesion, good step coverage (more particularly, conformal/continuous amounts of metal deposited onto the side-walls of an embedded structure), and minimal closure or "necking" of the top of the embedded feature.

To effectively plate a large surface area, a plating tooling makes electrical contact to the conductive seed layer in the edge region of the wafer substrate. There is generally no direct contact made to the central region of the wafer substrate. Thus, for highly resistive seed layers, the potential at the edge of the seed layer is significantly greater than at the central region of the seed layer, which is referred to as the "terminal effect". Without appropriate means of resistance and voltage compensation, this large edge-to-center voltage drop leads to a non-uniform plating thickness distribution, primarily characterized by thicker plating at the wafer substrate edge. This non-uniform plating thickness will be even more pronounced as the industry transitions from 300 mm wafers to 450 mm wafers.

SUMMARY

Methods, apparatus, and systems for plating metals are provided. According to various implementations, a plating apparatus may include a chamber housing a movable anode chamber or a movable shield. The movable anode chamber or the movable shield may be used to mitigate the terminal effect when an electroplating process begins. As the electroplating process proceeds, the movable anode chamber or the movable shield may be moved away from the substrate such that a uniform current density may be obtained across the face of the substrate.

According to one implementation, an apparatus includes a plating chamber, a substrate holder, an ionically resistive ionically permeable element, and an anode chamber housing an anode. The plating chamber is configured to contain an electrolyte while electroplating metal onto a substrate. The substrate holder is configured to hold the substrate and has one or more electrical power contacts arranged to contact an edge of the substrate and to provide electrical current to the substrate during electroplating. The ionically resistive ionically permeable element is positioned between the substrate and the anode chamber during electroplating. The ionically resistive ionically permeable element has a flat surface that is substantially parallel to and separated from a plating face of the substrate. The anode chamber is movable with respect to the ionically resistive ionically permeable element to vary a distance between the anode chamber and the ionically resistive ionically permeable element during electroplating. The anode chamber includes an insulating shield oriented between the anode and the ionically resistive ionically permeable element, with an opening in a central region of the insulating shield.

According to another implementation, an apparatus includes a plating chamber, a substrate holder, an ionically resistive ionically permeable element, an auxiliary cathode and an insulating shield. The plating chamber is configured to contain an electrolyte and an anode while electroplating metal onto a substrate. The substrate holder is configured to hold the substrate such that a plating face of the substrate is positioned at a distance from the anode during electroplating. The substrate holder has one or more electrical power contacts arranged to contact an edge of the substrate and to provide electrical current to the substrate during electroplating. The ionically resistive ionically permeable element is positioned between the substrate and the anode. In operation, the ionically resistive ionically permeable element has a flat surface that is substantially parallel to and separated from the plating face of the substrate. The insulating shield is positioned between the ionically resistive ionically permeable element and the anode. The auxiliary cathode is positioned between the anode and the ionically resistive ionically permeable element. The insulating shield is movable with respect to the ionically resistive ionically permeable element to vary a distance between the disks and the ionically resistive ionically permeable element during electroplating. The insulating shield includes an opening in the central region of the shield. Certain embodiments of the invention further include a secondary auxiliary cathode located in substantially the same plane as the substrate, peripherally oriented around the perimeter of the plating chamber.

According to another implementation, a method includes holding a substrate having a conductive seed and/or barrier layer disposed on its surface in a substrate holder of an apparatus. The apparatus includes a plating chamber and an anode chamber housing an anode, the plating chamber containing the anode chamber. The anode chamber includes an insulating shield oriented between the anode and an ionically resistive ionically permeable element, with an opening in a central region of the insulating shield. The surface of the substrate is immersed in an electrolyte solution and proximate the ionically resistive ionically permeable element positioned between the surface and the anode chamber. The ionically resistive ionically permeable element has a flat surface that is parallel to and separated from the surface of the substrate. A current is supplied to the substrate to plate a metal layer onto the seed and/or barrier layer. The anode chamber is moved from a first position to a second position, the second position being located a distance further away from the ionically resistive ionically permeable element than the first position.

According to another implementation, a non-transitory computer machine-readable medium includes program instructions for control of an apparatus. The program instructions include code for holding a substrate having a conductive seed and/or barrier layer disposed on its surface in a substrate holder of an apparatus. The apparatus includes a plating chamber and an anode chamber housing an anode, the plating chamber containing the anode chamber. The anode chamber includes an insulating shield oriented between the anode and an ionically resistive ionically permeable element, with an opening in a central region of the insulating shield. The surface of the substrate is immersed in an electrolyte solution and proximate the ionically resistive ionically permeable element positioned between the surface and the anode chamber. The ionically resistive ionically permeable element has a flat surface that is parallel to and separated from the surface of the substrate. A current is supplied to the substrate to plate a metal layer onto the seed and/or barrier layer. The anode chamber is moved from a first position to a second position, the second position being located a distance further away from the ionically resistive ionically permeable element than the first position.

These and other aspects of implementations of the subject matter described in this specification are set forth in the accompanying drawings and the description below.

BRIEF DESCRIPTION OF THE DRAWINGS

FIGS. 4A and 4B show examples of isometric projections of a movable shield.

DETAILED DESCRIPTION

Figure 1A:
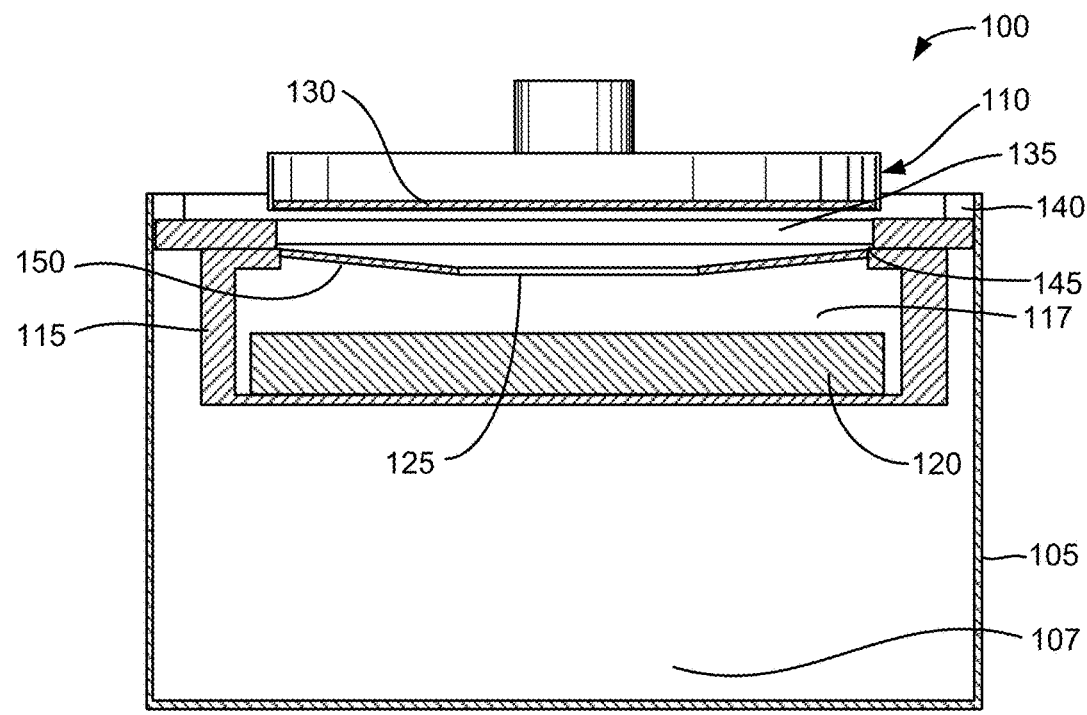
FIGS. 1A and 1B show an example of a cross-sectional schematic diagram of an electroplating apparatus with a movable anode chamber being at one position.

In the following detailed description, numerous specific implementations are set forth in order to provide a thorough understanding of the disclosed methods and apparatus. However, as will be apparent to those of ordinary skill in the art, the disclosed methods and apparatus may be practiced without these specific details or by using alternate elements or processes. In other instances well-known processes, procedures, and components have not been described in detail so as not to unnecessarily obscure aspects of the disclosed methods and apparatus.

In this application, the terms "semiconductor wafer," "wafer," "substrate," "wafer substrate," and "partially fabricated integrated circuit" are used interchangeably. One of ordinary skill in the art would understand that these terms can refer to a silicon wafer during any of many stages of integrated circuit fabrication thereon. The following detailed description assumes the disclosed implementations are implemented on a wafer substrate. However, the disclosed implementations are not so limited. The work piece may be of various shapes, sizes, and materials. In addition to semiconductor wafers, other work pieces that may take advantage of the disclosed implementations include various articles such as printed circuit boards and the like.

Further, in this application, the terms "plating solution," "plating bath," "bath," "electrolyte solution," and "electrolyte" are used interchangeably. One of ordinary skill in the art would understand that these terms can refer to a solution containing metal ions and possibly other additives for plating or electroplating a metal onto a work piece.

Implementations disclosed herein are related to configurations of and methods of using plating tool hardware for control of the electroplating current distribution on a wafer substrate having a high sheet resistance surface. Implementations disclosed herein are applicable to, for example, a 450 millimeter (mm) wafer which is seeded with a thin and resistive seed layer, such as a 5 nanometer (nm) thick copper seed layer having an about 50 Ohms per square (Ohms/square) sheet resistance. One attribute of the disclosed implementations is the ability to achieve a uniform thickness distribution both while plating a metal onto a thin resistive seed layer and during deposition onto a thick metal film.

Achieving a uniform current density across a 450 mm wafer substrate is challenging during the initial stages of damascene copper electroplating. This challenge is generated by the "terminal effect" which refers to the Ohmic resistance drop between a point at which contact is made to a wafer substrate (e.g., generally the edge of the wafer substrate) and the location of plating on the wafer substrate surface. The larger the distances from the contact point, the larger the voltage drop through the seed layer, with lower voltages resulting in slower plating. In the case of 450 mm wafers, the terminal effect is increased compared to, for example, 300 mm wafers, due to the increased distance between the wafer edge where electrical contact is made to a seed layer and the center of the wafer. The terminal effect may be further increased because the seed layer thickness for a 450 mm wafer is expected to decrease to about 5 nm, with a sheet resistance of about 50 Ohms/square. These two factors will result in a large voltage drop between the wafer edge and the wafer center and correspondingly different plating rates at the wafer edge and the wafer center.

Further complicating the problem for the thickness control of the plated metal is that as metal is plated onto a seed layer, the plated metal may increase the conductivity of the layer (i.e., the plated metal on the seed layer) by up to about 1000 times (1000×). Thus, the terminal effect decreases while plating is being performed because of the metal layer that is being plated yields a more uniform voltage across the wafer. This introduces the need for the electroplating hardware to produce a uniform plated metal thickness profile in the case of both large (e.g., at the beginning of an electroplating process) and small (e.g., after metal has been plated onto the seed layer) edge to center voltage decrease from the wafer edge to the wafer center.

Controlling the electroplating current distribution on wafer substrates having high sheet resistance surfaces can be performed using many different techniques. First, an electroplating chamber that incorporates an ionically resistive element having electrolyte-permeable pores or holes, where the element resides in close proximity of the wafer substrate, may aid in mitigating the terminal effect. Some of the ionically resistive ionically permeable elements described herein may present a uniform current density in the proximity of the wafer substrate and therefore serve as virtual anodes. Accordingly, some configurations of an ionically resistive ionically permeable element may also be referred to as a high-resistance virtual anode (HRVA).

HRVAs are effective in obtaining uniformity improvement both during plating on thin seed layers and on thick films. In the case of plating on 450 mm wafers with very thin seed layers, however, the HRVA resistance may be increased dramatically to yield a uniform thickness distribution. This may require hundreds of volts of power and may cause significant plating solution heating during the later portions of plating when a high current is used.

Second, an electroplating chamber that incorporates dynamic shields and bladders may aid in mitigating the terminal effect. Dynamic shields can selectively decrease the current density near the wafer substrate edge when the seed layer is thin and then increase the current density across the face of the wafer substrate to allow uniform plating on thicker metal films. Dynamic shields may be difficult to use in small plating cells, however. Further, under some conditions dynamic shields may concentrate current near the edge of the shield opening. The shield may also be referred to as a dynamic shield, movable shield or insulating shield.

Third, an electroplating chamber that incorporates auxiliary cathodes may aid in mitigating the terminal effect. An auxiliary cathode placed between the anode and the ionically resistive ionically permeable element, may be useful in shaping the current distribution from the anode. Furthermore, a secondary auxiliary cathode located in substantially the same plane as the substrate and positioned around the outer perimeter of the electroplating chamber may be useful in diverting current from the wafer substrate edge. This effect, however, may not extend into more central regions of a wafer substrate. Auxiliary cathodes which are deeper in the plating chamber can divert current from the bulk of the wafer substrate to a greater degree. As the wafer diameter increases to 450 mm, however, it may become ineffective to divert current from the bulk of the wafer to an auxiliary cathode as high currents may be required. Further, placing auxiliary cathodes directly below the face of a wafer substrate may be ineffective due to the very high currents required to selectively divert current from the wafer substrate edge.

Fourth, an electroplating chamber that incorporates multiple anodes may aid in mitigating the terminal effect. Concentric anodes can be used to selectively direct current to specific radial positions on a wafer substrate. This hardware configuration may suffer from drawbacks, however. For example, numerous power supplies may be needed, anode erosion may vary across the wafer substrate making maintenance more frequent, sharp transitions in the current on the wafer substrate may tend to occur at points of transition from one anode to another, and control of the thickness profile on the outer portion of the wafer substrate where terminal effect is the largest may be poor.

Apparatus

All of the above-described techniques may be used to aid in mitigating the terminal effect. Further, in many cases, the above-described techniques can be combined with one another and with other techniques to aid in mitigating the terminal effect. For example, in some implementations, an electroplating apparatus may include three features to mitigate the terminal effect. The first feature may be an auxiliary cathode configured to shape the current distribution from the anode and control the current density at the outer perimeter of the wafer substrate. The second feature may be an ionically conductive ionically resistive element. The third feature may be a movable anode chamber or a movable shield.

For example, a movable anode chamber may include an upwardly sloped top portion made of an insulating material such as plastic, with this top portion including a small opening (e.g., about 200 mm in diameter for a 450 mm wafer), as further described herein. The movable anode chamber may move during plating from a position close to the wafer substrate when the seed layer is thin to a position far from the wafer substrate when metal has been plated onto the wafer substrate. By this motion, the edge of the wafer substrate may be progressively unshielded as the sloped insulating top portion of the movable anode chamber moves away from the wafer substrate.

Figure 1B:
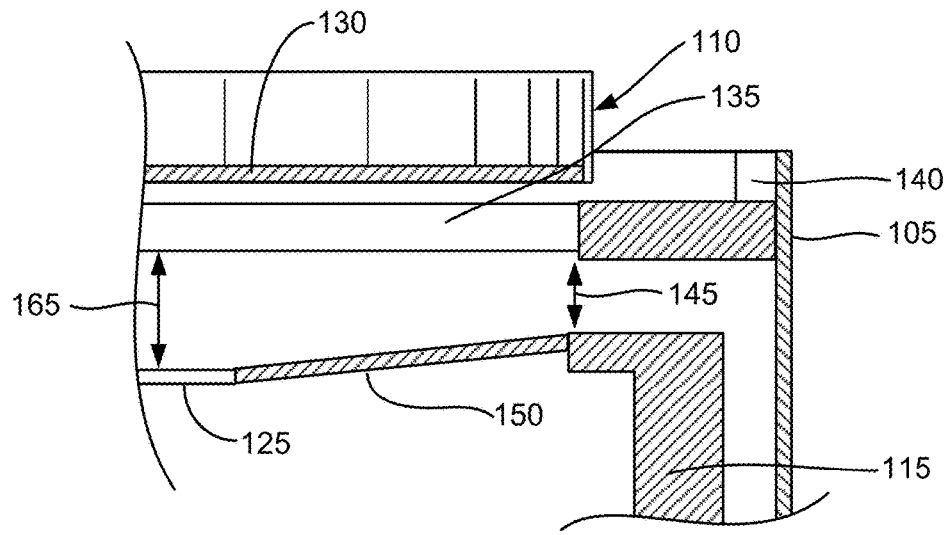
Figure 2:
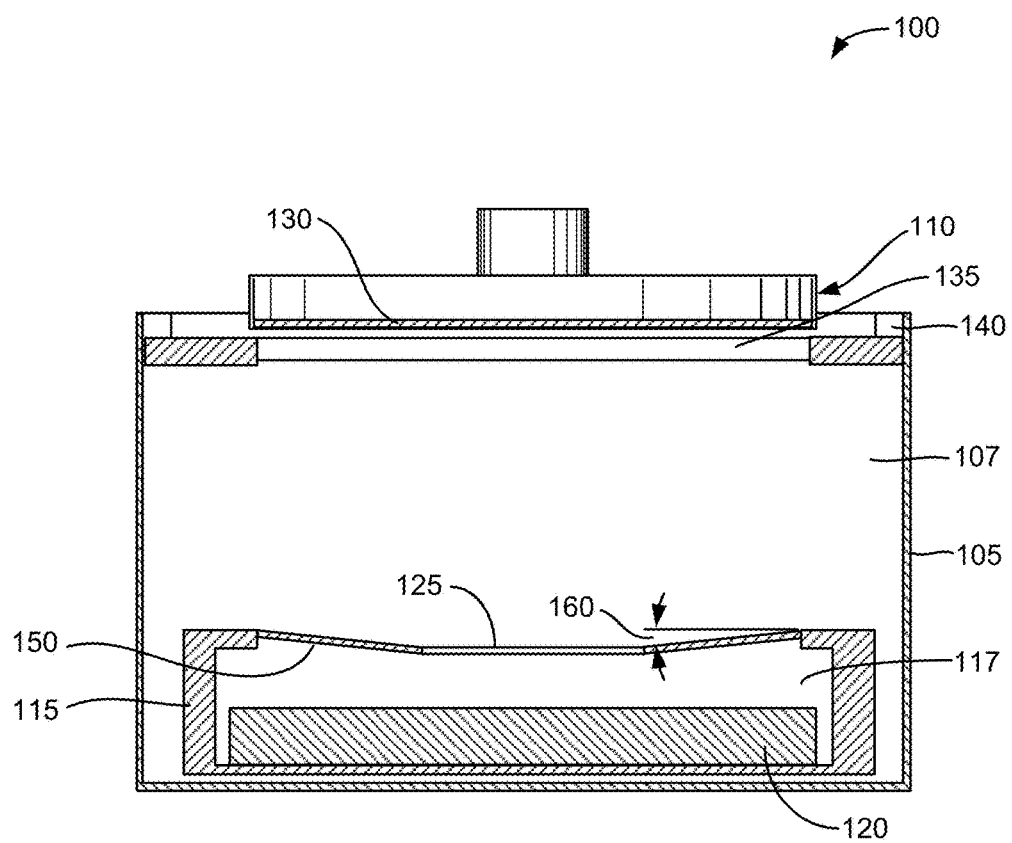
FIG. 2 shows an example of a cross-sectional schematic diagram of an electroplating apparatus with a movable anode chamber being at another position.

FIGS. 1A and 1B show an example of a cross-sectional schematic diagram of an electroplating apparatus with a movable anode chamber being at one position. FIG. 1B is an enlarged diagram of the upper right hand portion of the electroplating apparatus shown in FIG. 1A. FIG. 2 shows an example of a cross-sectional schematic diagram of an electroplating apparatus with a movable anode chamber being at another position. For example, the movable anode chamber as shown in FIGS. 1A and 1B is at its upper position. The movable anode chamber as shown in FIG. 2 is at its lower position. During an electroplating process, the movable anode chamber may move from its upper position to its lower position.

The electroplating apparatus 100 includes a chamber 105 and the movable anode chamber 115 containing an anode 120. In some implementations, the chamber 105 and the movable anode chamber 115 may be cylindrical to accommodate a circular wafer substrate 130. That is, in a top-down view of the electroplating apparatus 100, the chamber 105 and the movable anode chamber 115 may have circular cross-sections. The electroplating apparatus 100 further includes a substrate holder 110 that is configured to hold the wafer substrate 130 and an ionically conductive ionically resistive element 135 located between the anode chamber 115 and the substrate holder 110.

As shown in FIG. 1, the wafer substrate 130 is immersed in the electrolyte solution (e.g., the catholyte). In some implementations, the substrate holder 110 is a clamshell apparatus which makes contacts to the periphery of the wafer substrate 130 through a number of contact fingers housed behind an elastic "lip seal." The elastic lip seal serves to seal the clamshell and to keep the edge contact region and wafer backside substantially free of electrolyte, as well as to avoid any plating onto the contacts.

A clamshell apparatus is composed of two major pieces. The first piece of the clamshell is the cone. The cone can open, allowing for the insertion and the extraction of the wafer. The cone also applies pressure to the contacts and the seal. The second piece of the clamshell is the wafer holding cup. The bottom of the cup is generally made of (or coated with) an insulator to avoid any coupled corrosion and electrodeposition reaction which would occur, for example, on a metal that is placed into the electrolyte solution with a laterally varying potential, as is the case here. At the same time, however, the cup bottom needs to be mechanically strong (e.g., to press the cup up against the wafer and cone and avoid flexing) and thin (e.g., to avoid electrolyte flow disturbances near the wafer edge). Therefore, in some implementations, the cup bottom is a metal that is coated with an insulating material such as glass or plastic. A general description of a clamshell-type plating apparatus having aspects suitable for use with implementations disclosed herein is described in further detail in U.S. Pat. No. 6,156,167 and U.S. Pat. No. 6,800,187, which are both incorporated herein by reference.

In some implementations, the ionically conductive ionically resistive element 135 is a high-resistance virtual anode (HRVA). The HRVA may be about 0.25 inches to 1 inch thick, or about 0.5 inches thick. The open area of the HRVA may be about 1% to 2%. A HRVA with such an open area and an about 0.5 inch thickness may increase the electrolyte resistance across the volume that the HRVA occupies by about 50 times to 100 times (50× to 100×). Further details of implementations of the ionically conductive ionically resistive element 135 are given below.

An auxiliary cathode 350 is positioned between the anode 120 and the ionically resistive ionically permeable element 135. In certain embodiments, the auxiliary cathode is generally ring or annularly shaped to provide a significant impact on the current density distribution at the peripheral region of the work piece. In some instances, the auxiliary cathode 350 is also referred to as a thief cathode. The auxiliary cathode 350 may draw plating current from the adjacent edges of the wafer substrate 130 during an electroplating process. For example, the auxiliary cathode may reduce plating current at the edge (e.g., about 10 mm to 20 mm) of the wafer substrate when combined with the impact of the long resistive path though electrolyte generated by the narrow pathway between the movable anode chamber opening and the HRVA plate (described further, below). In some implementations, the auxiliary cathode 350 may be controlled with an independent power supply. Further details of implementations of an auxiliary cathode are given below.

The movable anode chamber 115 may be fabricated from an insulating material, such as a polymeric material or a plastic, for example. Such materials include polypropylene, high-density polyethylene (HDPE), and polyvinylidene fluoride (PVDF), for example. In some implementations, the anode chamber or pieces of the anode chamber may be machined from a polymeric material or a plastic. When the anode chamber is fabricated from different pieces a polymeric material or a plastic, the pieces of the anode chamber may be joined with a plastic welding process, for example.

The movable anode chamber 115 may further include an insulating shield 150. The insulating shield 150 also may be fabricated from an insulating material, such as a polymeric material or a plastic (e.g., polypropylene, high-density polyethylene (HDPE), and polyvinylidene fluoride (PVDF)), for example. The opening in the insulating shield 150, with the opening including a cationic membrane 125, may be about 15% to 80% of an area of the face of a wafer substrate 130, in some implementations. For example, for a 450 mm diameter wafer substrate, the opening in the insulating shield 150 may be about 140 mm to 250 mm in diameter, about 200 mm to 320 mm in diameter, about 240 mm to 300 mm in diameter, or about 200 mm in diameter. For a 300 mm diameter wafer substrate, the opening in the insulating shield may be about 200 mm to 270 mm in diameter. The size of the opening in the insulating shield determines in part the degree of terminal effect compensation provided by the movable anode chamber 115. For example, small openings in the insulating shield 150 will result in terminal effect compensation across a larger part of the wafer substrate due to the longer resistive path toward the wafer edge. Smaller openings in the insulating shield allow the process to run with less burden on the auxiliary cathode. However, if the opening is too small, the terminal effect will be overcompensated for, and a center-thick profile will result.

The chamber 105, while containing the movable anode chamber 115, may contain a different electrolyte solution than the movable anode chamber 115, in some implementations. For example, the chamber 105 may contain a first electrolyte solution 107, sometimes referred to as a catholyte. The movable anode chamber 115 may contain a second electrolyte solution 117, sometimes referred to as the anolyte. In some implementations, the anolyte may have a similar composition as the catholyte, but exclude additives such as accelerators, levelers, and/or suppressors, for example. The two electrolyte solutions may be separated by the cationic membrane 125 associated with the movable anode chamber 115. In some other implementations, the chamber 105 and the movable anode chamber 115 may contain the same electrolyte solution.

The cationic membrane 125 allows for ionic communication between the movable anode chamber 115 and the chamber 105, while preventing the particles generated at the anode 120 from entering the proximity of the wafer substrate 130 and contaminating it. The cationic membrane 125 may also be useful in prohibiting non-ionic and anionic species such as bath additives from passing though the membrane and being degraded at the anode surface, and to a lesser extent in redistributing current flow during the plating process and thereby improving the plating uniformity. Detailed descriptions of suitable ionic membranes are provided in U.S. Pat. Nos. 6,126,798 and 6,569,299, both incorporated herein by reference. Further description of suitable cationic membranes is provided in U.S. patent application Ser. No. 12/337,147, titled "Electroplating Apparatus With Vented Electrolyte Manifold," filed Dec. 17, 2008, incorporated herein by reference. Yet further detailed description of suitable cationic membranes is provided in U.S. patent application Ser. No. 12/640,992, titled "PLATING METHOD AND APPARATUS WITH MULTIPLE INTERNALLY IRRIGATED CHAMBERS," filed Dec. 17, 2009, incorporated herein by reference.

In some implementations, the anode 120 may be a disk of material having a diameter similar to the diameter of the wafer substrate 130. For example, the diameter of the anode 120 may be about 450 mm when the wafer substrate 130 has a diameter of about 450 mm. The thickness of the anode 120 may be about 4 cm to 8 cm, or about 6 cm. In some implementations, the anode may include pieces of a disk of material such that the disk may be easily replaced. In some other implementations, the anode may be small spheres or pieces of material that fill a similar space that a disk would. For example, the anode may be spheres of material with a diameter of about 0.5 cm to 2.5 cm, or about 1.5 cm.

As noted above, the movable anode chamber 115 can move from an upper position (e.g., as shown in FIGS. 1A and 1B) to a lower position (e.g., as shown in FIG. 2) during an electroplating process. The distance between the upper position and the lower position may about 2 centimeters (cm) to 20 cm, in some implementations. For example, the movable anode chamber 115 may move in the chamber 105 about 2 cm to 20 cm to vary the distance between the movable anode chamber 115 and the ionically conductive ionically resistive element 135. In some other implementations, the distance between the upper position and the lower position may about 2 cm, about 10 cm, or about 8 cm to 20 cm.

When the movable anode chamber 115 is in its upper position, it may be close to the wafer substrate 130, with the ionically conductive ionically resistive element 135, which may be directly below the wafer substrate 130, being between the wafer substrate 130 and the movable anode chamber 115. In some implementations, a distance between the face of the ionically conductive ionically resistive element 135 facing the wafer substrate 130 and the face of the wafer substrate 130 may be about 1 mm to 8 mm. In some implementations, smaller distances may be difficult to control.

In some implementations, the insulating shield 150 may be substantially flat and substantially parallel to the face of the ionically conductive ionically resistive element 135 it faces. In some other implementations, the insulating shield 150 may angle downwards from its outer perimeter to its inner perimeter, with the inner perimeter defining the opening. For example, the angle 160 the insulating shield 150 makes with a horizontal plane may be about 0 degrees to 30 degrees, or about 15 degrees, in some implementations. That is, in some implementations, the insulating shield 150 may form a truncated cone (a truncated cone is the result of cutting a cone by a plane parallel to the base and removing the part containing the apex). In some implementations, the insulating shield being angled or sloped may aid in compensating for the terminal effect related to seed layer resistance. An insulating shield 150 with lower angles to a horizontal plane combined with a closer spacing to the ionically conductive ionically resistive element 135 yields a stronger compensation of Ohmic voltage drops through the seed layer, in some implementations. In some other implementations, the insulating shield 150 may have a complex shape such as an initially high angle near the wafer center and a more gradual slope near the wafer edge.

In some implementations, the distance 145 between the ionically conductive ionically resistive element 135 and the anode chamber 115 edge (e.g., or the outer perimeter of the insulating shield 150) may be on the order of a few millimeters when the anode chamber 115 is in its upper position. In some other implementations, the distance 145 may be about 1 mm to 10 mm. In some implementations, when the insulating shield 150 is substantially flat and substantially parallel to the face of the ionically conductive ionically resistive element 135 and when the anode chamber 115 is in its upper position, a distance 165 between the ionically conductive ionically resistive element 135 and the anode chamber 115 (e.g., or the inner perimeter of the insulating shield 150 or the cationic membrane 125) may be on the order of a few millimeters or about 1 mm to 10 mm. In some other implementations, when the insulating shield 150 includes a sloped portion or portions, the distance 165 may be about 3 mm to 50 mm or about 20 mm to 30 mm.

With the movable anode chamber 115 having an opening at its center, as defined by insulating shield 150 with the cationic membrane 125, there is a long path through the electrolyte to the ionically conductive ionically resistive element 135 near the edge of the wafer substrate 130. This long path has a relatively high electrical resistance and thereby inhibits current flow to the edge of the wafer substrate 130. In effect, the high resistance through the electrolyte between the opening in the movable anode chamber 115 (when the movable anode chamber is in its upper position) and the ionically conductive ionically resistive element 135 counteracts the high resistance through the seed layer from the wafer substrate edge to the wafer substrate center. In some implementations, the auxiliary cathode 350 also may be used when electroplating on a resistive seed layer when the anode chamber 115 is at its upper position to further aid in mitigating the terminal effect. When the distance between the face of the ionically conductive ionically resistive element 135 facing the wafer substrate 130 and the face of the wafer substrate 130 is large (e.g., greater than about 8 mm), however, the impact of the ionically conductive ionically resistive element 135 and the anode chamber 115 in its upper position may be degraded.

Thus, with the movable anode chamber 115 being at its upper position as shown in FIGS. 1A and 1B, the terminal effect due to resistive seed layers may be counterbalanced. The terminal effect diminishes, however, as the metal thickness increases during an electroplating process. With the terminal effect diminishing, the movable anode chamber 115 being at its upper position may result in a thick metal layer at the center of the wafer substrate, which is not desired.

Therefore, when the terminal effect due to a thin resistive seed layer begins to diminish due to a metal being plated onto the seed layer, the anode chamber 115 may be moved away from the ionically conductive ionically resistive element 135. As electroplating onto the seed layer progresses, the anode chamber 115 may be moved further and further away from the ionically conductive ionically resistive element 135 until the anode chamber 115 is at its lower position, as shown in FIG. 2. When the anode chamber 115 is at its lower position, the path through the electrolyte from the opening in the insulating shield 150 to both the wafer substrate edge and the wafer substrate center approaches the same value. Small differences in this path may become negligible due to the resistance of the ionically conductive ionically resistive element 135, for example. Any type of mechanism may be used to move the movable anode chamber 115 to different positions in the chamber 105. In some implementations, a pneumatic mechanism or a mechanical mechanism may be used.

In some implementations, the rate of movement of the anode chamber 115 may be faster at the start of a plating process than at later stages in the plating process. This may be due to large changes in the seed layer conductivity at the beginning of the plating process. That is, when a plating process starts, the seed layer conductivity may initially increase rapidly as metal is plated onto the seed layer, and then increase at a slower rate as additional metal is plated. For example, in some implementations, the anode chamber 115 may move at a rate of about 0.5 centimeters per second (cm/s) to 2 cm/s in the first few seconds of plating. In some implementations, the anode chamber 115 may move at a rate of about 0.1 cm/s to 0.5 cm/s after the first few seconds or after the first 5 seconds of plating.

In some implementations, the current applied to the auxiliary cathode 350 may be coordinated with the movement of the anode chamber 115 so that a uniform current density across the wafer substrate 130 is maintained as metal is plated onto the wafer substrate 130. Generally, the current applied to the auxiliary cathode 350 decreases in conjunction with movement of the anode chamber 115 away from the ionically conductive ionically resistive element 135. In some implementations, the auxiliary cathode 350 may not be used when electroplating on thick metal films when the anode chamber 115 is at its lower position. The auxiliary cathode 350 may be used, however, when the anode chamber 115 is at its lower position when a thin layer of metal at the wafer substrate edge is desired.

For example, in some implementations, the anode chamber may be in its upper position when electroplating copper onto a 0 nm to 5 nm thick copper seed layer or onto a combination of copper seed layer and copper plated layer. A layer of copper 0 nm to 5 nm thick may have a sheet resistance of about 50 Ohms/square to 5 Ohms/square or about 50 Ohms/square to 10 Ohms/square. As the copper electroplating process progresses, the anode chamber may move with time to about 2 cm to 4 cm below its upper position while the next about 10 nm of copper is being deposited. The movement of the anode chamber from the upper position to about 2 cm to 4 cm below the upper position may take place in the first few seconds after the electroplating process begins. The sheet resistance of the copper layer may be about 2 Ohms/square at this point in the process. As the copper electroplating process continues, the anode chamber may move with time to about 8 cm to 20 cm below its upper position while the next about 30 nm of copper is being deposited. The sheet resistance of the copper layer may be about 0.4 Ohms/square at this point in the process. The anode chamber may reach its lower position when the plated copper thickness is greater than about 50 nm.

In some implementations, the current density may be lower (e.g., about 3 to 10 milliamps per square centimeter (mA/cm$^2$)) during the initial stages of plating with the anode chamber in its upper position compared to later stages of plating. In some implementations, the current density may be about 30 to 50 mA/cm$^2$ in the later stages of plating when the anode chamber is at its lower position.

In summary, when a movable anode chamber with an opening in the insulating shield is at its upper position, the wafer substrate edges may be isolated from the anode. When the movable anode chamber is at its lower position, electroplating onto a thick metal layer may be uniform rather than a center-thick profile. The movable anode chamber may be combined with an ionically conductive ionically resistive element and an auxiliary cathode to effectively compensate for the terminal effect, in some implementations.

In some other implementations, a cationic membrane may not be associated with the movable anode chamber and may instead be located below the ionically conductive ionically resistive element. Thus, the distance 145 between the anode chamber 115 and ionically conductive ionically resistive element 135 may be determined, in some implementations, in part by this cationic membrane. In these implementations, the cationic membrane may include slopes and/or angles to match the insulating shield (e.g., when the insulating shield includes slopes and/or angles). Further, in these implementations, the electrolyte below the cationic membrane may be shared with the anode chamber when there is not another membrane in the opening of the insulting shield of the anode chamber.

In some other implementations, an electroplating apparatus may include a movable shield instead of a movable anode chamber. A movable shield may be combined with other techniques to aid in mitigating the terminal effect. For example, in some implementations, an electroplating apparatus may include an auxiliary cathode, an ionically resistive ionically conductive element, and a movable shield. Some implementations further include a secondary auxiliary cathode 348.

Figure 3A:
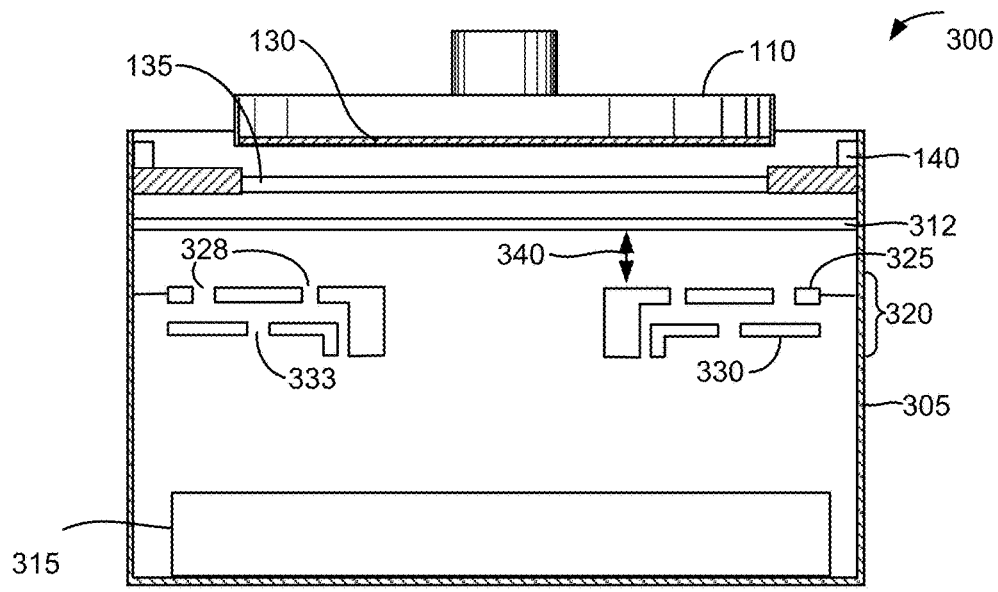
FIGS. 3A and 3B show examples of a cross-sectional schematic diagram of an electroplating chamber with a movable shield being at one position.
Figure 3B:
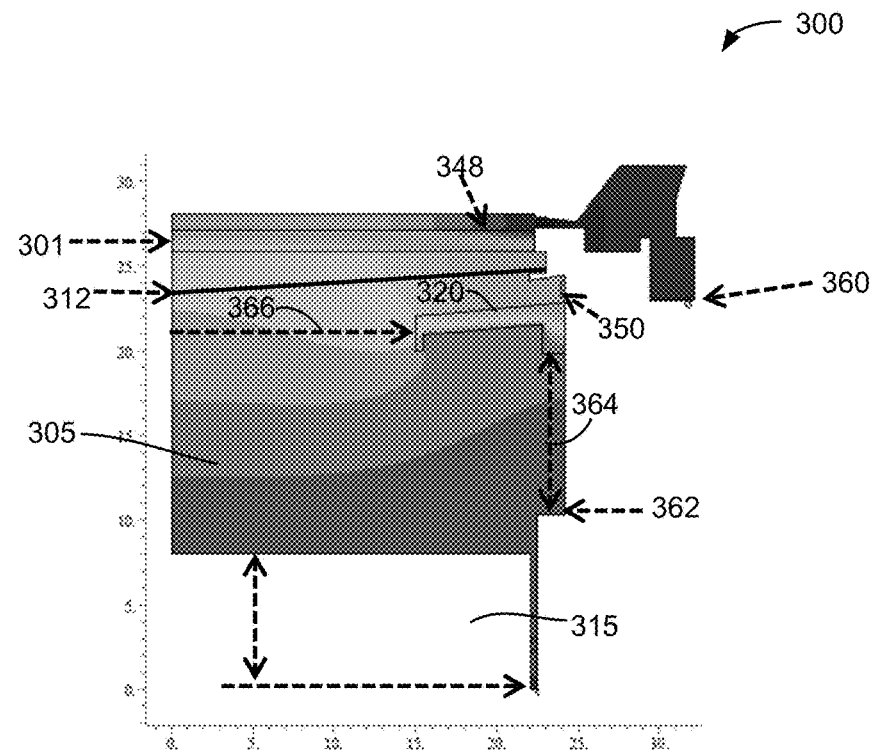
Figure 3C:
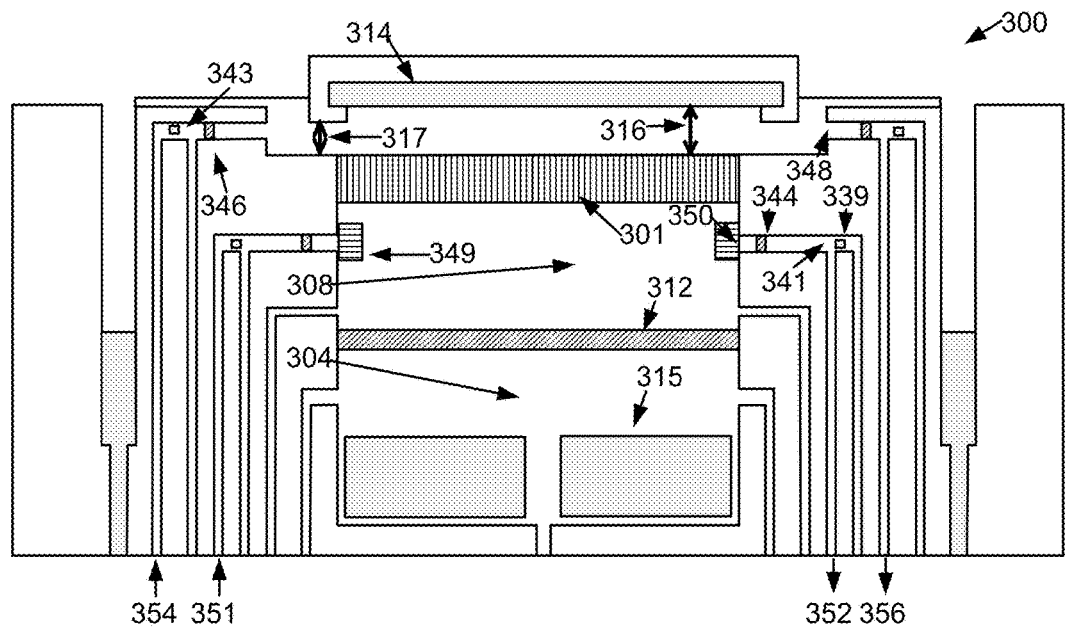
FIGS. 3C-3F are cross-sectional schematic views emphasizing different components of a representative electroplating apparatus in accordance with embodiments presented herein.

FIGS. 3A and 3B shows examples of a cross-sectional schematic diagram of an electroplating apparatus with a movable shield. Similar to the electroplating apparatus 100 shown in FIGS. 1A, 1B, and 2, the electroplating apparatus 300 includes a chamber 305 and a substrate holder 110 that is configured to hold a wafer substrate 130. An ionically conductive ionically resistive element 135 may be located between an anode 315 and the substrate holder 110. An auxiliary cathode 350 may be positioned between the anode 120 and the ionically resistive ionically permeable element 135. FIGS. 3C-3F show further examples of cross-sectional schematic diagrams of an electroplating apparatus according to certain embodiments, and are discussed in more detail below.

The electroplating apparatus 300 further includes a movable shield 320 positioned between the ionically resistive ionically permeable element 135 and the anode 315. In some implementations, the movable shield may include two insulating disks 325 and 330. FIGS. 4A and 4B show examples of isometric projections of one implementation of the movable shield 320. FIG. 4A shows a top-down view, and FIG. 4B shows a bottom-up view. In other implementations, the movable shield 320 is a single piece.

The movable shield may include an opening in the central region therein. For example, for a 450 mm diameter wafer substrate, the opening in the movable shield may be about 140 mm to 250 mm in diameter, about 200 mm to 320 mm in diameter, about 240 mm to 300 mm in diameter, or about 200 mm in diameter. For a 300 mm diameter wafer substrate, the opening in the insulating shield may be about 200 mm to 270 mm in diameter.

In some implementations, the electroplating apparatus 300 includes a cationic membrane 312 separating the chamber 305 into a catholyte chamber and an anolyte chamber containing the anode 315. While the cationic membrane 312 in the electroplating apparatus 300 is located above a movable shield 320 (i.e., the movable shield is in the anolyte chamber), in some implementations, the cationic membrane 312 may be located below the movable shield 320 (i.e., the movable shield is in the catholyte chamber).

In some implementations, the anode 315 may be a disk of material having a diameter similar to the diameter of the wafer substrate 130. For example, the diameter of the anode 315 may be about 450 mm when the wafer substrate 130 has a diameter of about 450 mm. The thickness of the anode 315 may be about 4 cm to 8 cm, or about 6 cm. In some implementations, the anode may include pieces of a disk of material such that the disk may be easily replaced. In some other implementations, the anode may be small spheres of pieces of material that fill a similar space that a disk would. For example, the anode may be spheres of material with a diameter of about 0.5 cm to 2.5 cm, or about 1.5 cm.

In some implementations the movable shield 320 comprises two insulating disks 325 and 330. The first insulating disk 325 of the movable shield 320 includes an opening 326, and the second insulating disk 330 includes an opening 331. The openings 326 and 331 are in the central regions of the insulating disks 325 and 330, respectively. An area of the openings 326 and 331 in the first and the second insulating disks 325 and 330 may be about 15% to 80% of an area the plating face of the substrate, in some implementations. The first insulating disk 325 may include a flange 327 that fits within the opening 331 of the second insulating disk 330. The second insulating disk 330 may include a plurality of ridges 332 to increase the rigidity of the insulating disk. Each insulating disk may be about 0.5 cm to 2 cm thick, or about 1.3 cm thick. The outer diameter of the movable shield 320 may be slightly larger than a diameter of the wafer substrate that is to be plated in the electroplating apparatus. For example, for a 450 mm diameter wafer, the outer diameter of the movable shield 320 may be about 460 mm to 500 mm, or about 480 mm. The movable shield 320 may be made out of an insulating material, such as a polymeric material or a plastic, for example. Such materials include polyphenylene sulfide (PPS), polyethylene terephthalate (PET), polycarbonate, clear polyvinyl chloride (PVC), polypropylene, polyvinylidene fluoride (PVDF), and polytetrafluoroethylene (PTFE), for example.

The first insulating disk 325 may include a plurality of holes 328, and the second insulating disk 330 also may include a plurality of holes 333. When the first insulating disk 325 and the second insulated disk 330 are in contact with one another or located close to one another, no fluid (e.g., electrolyte) may be able to flow though the plurality of holes 328 and 333 due to the holes in each of the disks being offset from one another. When the first insulating disk 325 and the second insulated disk 330 are separated from one another by a small distance, however, fluid (e.g., electrolyte) may be able to flow though the plurality of holes 328 and 333. The distance of separation needed for a fluid to be able to flow though the plurality of holes 328 and 333 may be about 0.5 mm to 2 mm, in some implementations.

The movable shield 320 may have an upper position and a lower position in the chamber 305. In some implementations, a distance 340 between the ionically conductive ionically resistive element 135 and the movable shield 320 may be on the order of a few millimeters when the movable shield 320 is in its upper position. In some other implementations, the distance 340 may be about 1 mm to 10 mm. The movable shield 320 may be about 12 cm to 21 cm, about 15 cm to 18 cm, or about 7 to 14 cm from the anode 315 when the movable shield 320 is in its upper position. The distance between the upper position and the lower position of the movable shield may be about 5 cm to 15 cm, about 6 cm to 12 cm, or about 10 cm. The movable shield 320 may be about 2 cm to 11 cm or about 5 cm to 8 cm from the anode 315 when the movable shield 320 is in its lower position.

When the movable shield 320 is in its upper position, the first and the second insulating disks 325 and 330 may be close to one another such that no electrolyte is able to flow through the plurality of holes 328 and 333. In this configuration, the terminal effect due to a thin resistive seed layer on a wafer substrate may be counterbalanced because of the long path through the electrolyte from the anode 315 to the edge of the wafer substrate 130 (i.e., the path from the anode must pass through the central openings 326 and 331 in the first and the second insulating disks 325 and 330). This long path may have a relatively high electrical resistance and thereby inhibit current flow to the edge of the wafer substrate 130. In effect, the high resistance through the electrolyte between central openings 326 and 331 in the insulating disks 325 and 330 and the ionically conductive ionically resistive element 135 may counteract the high resistance through the seed layer from the wafer substrate edge to the wafer substrate center.

The terminal effect diminishes, however, as the metal thickness increases during electroplating. With the terminal effect diminishing, the movable shield 320 being at its upper position may result in a thick metal layer at the center of the wafer substrate, which is not desired.

Thus, when the terminal effect due to a thin resistive seed layer begins to diminish due to a metal being plated onto the seed layer, the movable shield 320 may be moved away from the ionically conductive ionically resistive element 135. As electroplating onto the seed layer progresses, the movable shield 320 may be moved further and further away from the ionically conductive ionically resistive element 135 until the movable shield 320 is at its lower position. As the movable shield 320 is moved from its upper position to its lower position, the first and the second insulating disks 325 and 330 may be separated from one another by an increasing distance as the movable shield 320 moves down. When the movable shield 320 is at its lower position, the first and the second insulating disks 325 and 330 may be separated from one another by about 0.5 mm to 10 mm. Any type of mechanism may be used to move the movable shield to different positions in the chamber. In some implementations, a pneumatic mechanism or a mechanical mechanism may be used.

Thus, as the movable shield 320 moves from its upper position to its lower position, a larger amount of electrolyte may be permitted to flow though the plurality of holes 328 and 333 in each of the insulating disks 325 and 330. This allows for alternate electrically conductive paths though the electrolyte (i.e., through the plurality holes in the insulating disks) as metal is plated onto the wafer substrate and the terminal effect diminishes. By the motion of the movable shield 320 and by the motion of the insulating disks 325 and 330 relative to one another (i.e., to allow electrolyte to flow through the plurality of holes), the edge of the wafer substrate may be progressively unshielded, allowing for an even current distribution across the face of the wafer substrate when plating onto a thicker metal layer.

In some implementations, the rate of movement of the movable shield 320 may be faster at the start of a plating process than at later stages in the plating process. This may be due to large changes in the seed layer conductivity at the beginning of the plating process. That is, when a plating process starts, the seed layer conductivity may initially increase rapidly as metal is plated onto the seed layer, and then increase at a slower rate as additional metal is plated. For example, in some implementations, the movable shield 320 may move at a rate of about 0.4 centimeters per second (cm/s) to 2 cm/s in the first few seconds of plating. In some implementations, the movable shield 320 may move at a rate of about 0.1 cm/s to 0.8 cm/s after the first few seconds or after the first 5 seconds of plating.

For example, in some implementations, the movable shield may be is its upper position when electroplating copper onto a 0 nm to 5 nm thick copper seed layer or a combination of copper seed layer and copper plated layer. A layer of copper 0 nm to 5 nm thick may have a sheet resistance of about 50 Ohms/square to 5 Ohms/square or about 50 Ohms/square to 10 Ohms/square. As the copper electroplating process progresses, the shield may move with time to about 0.1 cm to 3 cm below its upper position while the next about 10 nm of copper is being deposited. The sheet resistance of the copper layer may be about 2 Ohms/square at this point in the process. As the copper electroplating process continues, the may move with time to about 3 cm to 10 cm below its upper position while the next about 30 nm of copper is being deposited. The sheet resistance of the copper layer may be about 0.4 Ohms/square at this point in the process. The movable shield may reach its lower position when the plated copper thickness is greater than about 50 nm.

In other implementations, electroplating may be allowed to progress for several seconds while the movable shield remains fixed at an upper position. For example, the shield may remain fixed at the upper position for the first approximately 4 to 8 seconds, or the first 6 seconds of electroplating. During this stage, the auxiliary cathode and secondary auxiliary cathode, if used, may both be receiving current. Then, the movable shield may begin to move from the upper position to the lower position at a rate of approximately 6 to 8 millimeters/second. In certain embodiments, the auxiliary cathode is turned off or begins ramping down before the movable shield begins to move. In other embodiments, the auxiliary cathode is not turned off or ramped down until after the movable shield is in motion.

The secondary auxiliary cathode may be turned off or begin ramping down before, during or after the movable shield moves from its upper position to its lower position. In most implementations where a secondary auxiliary cathode is used, the secondary auxiliary cathode will continue to receive current for a period of time after the current to the auxiliary cathode has been turned off or has begun ramping down. For example, in certain instances the auxiliary cathode may be turned off when the shield is still in its upper position, while the secondary auxiliary cathode may be turned off after the shield reaches its lower position. Electroplating may continue after both the auxiliary and secondary auxiliary cathodes are turned off.

FIG. 3B shows another example of a cross-sectional schematic diagram of part of an electroplating chamber for plating a 450 millimeter wafer. In particular, this figure focuses on one half of the electroplating chamber, from center of the chamber (r=0 millimeters) out to an edge of the chamber (r=225 millimeters). In this example, the anode 315 has a radius of 220 millimeters and a height of about 80 millimeters. The shieldstop 362 (the point where the shield stops moving) is located in this example at a height of about 100 millimeters, or 20 millimeters above the anode. In some implementations, however, the distance between the anode and the shieldstop may be less than or greater than this distance.

The shield movement 364 in this example is 95 millimeters, representing the distance that the shield 320 travels over the course of the electroplating process. In other embodiments, the shield movement 364 is between about 75 and 120 millimeters. The shield opening 366 in this example has a radius of 150 millimeters. In other instances, the radius of the shield opening 366 ranges between about 100 to 160 millimeters, or between about 120 to 150 millimeters. For a 300 millimeter wafer, the shield opening 366 may be between about 100 and 135 millimeters.

The auxiliary cathode ring 350 in this example is ½ inch tall. In other implementations, the auxiliary cathode 350 may be between about 0.25 and 1 inch tall. Generally, taller auxiliary cathodes are better able to shape the current from the anode because they can move more current. However, the height of the auxiliary cathode 350 is limited by the desired shield movement 364. In other words, because in many implementations the movable shield 320 is below the auxiliary cathode 350 at all times during operation, a taller auxiliary cathode 350 results in less available distance for the shield 320 to move. In most implementations, auxiliary cathode 350 is located about 20 to 40 millimeters below the ionically resistive ionically permeable element 301, for example 30 millimeters below.

The secondary auxiliary cathode ring 350 in this example is about 1 inch wide, and it resides in a side channel, as shown. In some embodiments of the invention, the secondary auxiliary cathode 350 may be between 0.25 and 1 inches wide. In other embodiments, the secondary auxiliary cathode may be absent. The virtual secondary auxiliary cathode 348 is located at the point where the physical secondary auxiliary cathode ring 360 acts to divert current from the edge of the substrate during electroplating. In this example the virtual secondary auxiliary cathode 348 is located above the ionically resistive ionically permeable element (HRVA) 301, at the position where the side channel holding the secondary auxiliary cathode 348 meets the rest of the electroplating chamber 305.

The cationic membrane 312 is found between the ionically resistive ionically permeable element 301 and the anode 315. The cationic membrane 312 is above both the shield 320 and the auxiliary cathode 350. In most implementations, the cationic membrane 312 is between 10 and 30 millimeters above the uppermost position of the shield 320, for example 10 millimeters above the shield. The distance between the anode 315 and the substrate 130, in most implementations, is between about 150 and 250 millimeters.

In examples where the movable shield 320 includes two insulating disks, the distance between the first and the second insulating disks may be increased as the movable shield is moved from its upper position to its lower position. For example, at the upper position of the movable shield, the insulating disks may be positioned with respect to one another such that electrolyte cannot flow though the plurality of holes. At the lower position of the movable shield, the insulating disks may be positioned at a distance from one another such that electrolyte can flow though the plurality of holes. The separation between the first and the second insulating disks may be increased with time, in some implementations.

In some other implementations, instead of the first and the second insulating disks allowing the flow of electrolyte through the plurality of holes as the disks are separated from one another, the disks may be rotated with respect to one another to allow for the flow of electrolyte through the plurality of holes. For example, when the first and the second insulating disks are at one position with respect to one another, a plurality of holes in the first insulating may not overlap with a plurality of holes in the second insulating disk. When the first and the second insulating disks are rotated to another position with respect to one another, however, the plurality of holes in the first insulating disk may overlap with the plurality of holes in the second insulating disk such that a fluid is able to flow though the plurality of holes.

In further implementations, the first and the second insulating disks may be associated with a movable anode chamber. For example, the movable anode chamber described with respect to FIGS. 1A, 1B, and 2 may include the first and the second insulating disks described with respect to FIGS. 3A, 3B and 4, with the insulating disks replacing the insulating shield. A plating chamber with such an anode chamber may provide for further mitigation of the terminal effect, in some implementations.

The apparatus described herein may include hardware for accomplishing the process operations, as described above, and also include a system controller (not shown) having instructions for controlling process operations in accordance with the disclosed implementations. The system controller may include one or more memory devices and one or more processors configured to execute the instructions so that the apparatus can perform a method in accordance with the disclosed implementations. Machine-readable media containing instructions for controlling process operations in accordance with the disclosed implementations may be coupled to the system controller.

Structure of the Ionically Conductive Ionically Resistive Element

In some implementations, the ionically resistive ionically permeable element is a microporous plate or disk having a continuous three-dimensional network of pores (e.g., plates made of sintered particles of ceramics or glass). For example, a porous plate has a three-dimensional pore network including intertwining pores through which ionic current can travel both vertically up through the disk in the general direction of the anode to wafer substrate, as well as laterally (e.g., from the center to the edge of the disk). Examples of suitable designs for such plates are described in U.S. Pat. No. 7,622,024, which is herein incorporated by reference.

In some other implementations, through-holes are provided in the ionically resistive ionically permeable element to form channels that do not substantially communicate with one another within the body of the element, thereby minimizing lateral movement of ionic current in the element. Current flows in a manner that is one-dimensional, substantially in the vector direction that is normal to the closest plated surface near the resistive element.

The ionically resistive ionically permeable element having 1-D through-holes (also referred to as a HRVA or a 1-D porous HRVA) is sometimes a disk (other shapes may also be used) made of an ionically resistive material having a plurality of holes drilled (or otherwise made) through it. The holes do not form communicating channels within the body of the disk and generally extend through the disk in a direction that is substantially normal to the surface of the wafer. A variety of ionically resistive materials can be used for the disk body, including but not limited to polycarbonate, polyethylene, polypropylene, polyvinylidene diflouride (PVDF), polytetrafluoroethylene, polysulphone, and the like. The disk materials may be resistant to degradation in acidic electrolyte environment, relatively hard, and easy to process by machining.

In some implementations, the ionically resistive element is a HRVA having a large number of isolated and unconnected ionically permeable through-holes (e.g., a resistive disk having multiple perforations or pores allowing for passage of ions) in close proximity to the work piece, thereby dominating or "swamping" the overall system's resistance. When sufficiently resistive relative to the wafer sheet resistance, the element can be made to approximate a uniform distribution current source. By keeping the work piece close to the resistive element surface, the ionic resistance from the top of the element to the surface is much less than the ionic path resistance from the top of the element to the work piece edge, compensating for the sheet resistance in the thin metal film and directing a significant amount of current over the center of the work piece. Some benefits and details associated with using an ionically resistive ionically permeable element in close proximity of the substrate are discussed in detail in the U.S. Pat. No. 7,622,024, which is herein incorporated by reference.

Regardless of whether the ionically resistive ionically permeable element permits one or more dimensional current flow, it is preferably co-extensive with the wafer substrate, and therefore has a diameter that is generally close to the diameter of the wafer that is being plated. Thus, for example, the element diameter may be about 150 mm and 450 mm, with an about 200 mm element being used for a 200 mm wafer, an about 300 mm element for a 300 mm wafer, and an about 450 mm element for a 450 mm wafer, and so forth. In those instances where the wafer has a generally circular shape but has irregularities at the edge, e.g., notches or flat regions where wafer is cut to a chord, a disk-shaped element can still be used, but other compensating adjustments can be made to the system, as described in U.S. patent application Ser. No. 12/291,356, filed Nov. 7, 2008.

In some implementations, the element has a diameter that is greater than the diameter of the wafer to be plated (e.g., greater than 200 mm, 300 mm, or 450 mm), and has an outer edge portion that is hole-free (in the case of a one-dimensional HRVA). Such edge portion can be used to create a small gap about the periphery of the wafer (a peripheral gap between the HRVA edge portion and either the wafer edge or the bottom of wafer-holding cup), and to assist in mounting the HRVA within the chamber, e.g., to a chamber wall. In some implementations the size of the hole-free HRVA edge is about 5 mm to 50 mm from the outer edge of the HRVA to the edge of the portion of the HRVA that has holes.

In the case of a one-dimensional HRVA, the number of through-holes made in the disk may be relatively large, but the diameter of each hole may be quite small. Generally, the diameter of each hole generally is less than about ¼ of the HRVA to wafer gap. In some implementations, the number of holes is about 6,000 to 12,000, with each hole (or at least 95% of holes) having a diameter (or other principal dimension) of less than about 1.25 mm. In some implementations, the thickness of the HRVA may be about 5 mm to 50 mm, e.g., about 10 mm to 25 mm. In some implementations, a HRVA may be about 5% porous or less.

In some other implementations, it may be advantageous to use a HRVA having regions with non-uniform distributions of holes, or with holes that are blocked such that the wafer experiences a non-uniform hole distribution. Such a hole distribution may permanently direct more current to the center of the wafer, such that a high resistance seed layer is more uniformly plated than if a uniform hole distribution is used. A thick film (i.e., with a low sheet resistance), however, will tend to plate more non-uniformly if a non-uniform hole distribution is used. The blocked or missing holes may be non-uniform in the radial, azimuthal, or both directions. In some implementations, the ionically resistive ionically permeable element is positioned substantially parallel to the wafer and anode surface, and the one-dimensional through-holes are oriented parallel to the direction between the wafer and anode surface. In some other implementations, at least some of the holes have their relative angle modified to change the hole length relative to the element thickness, and thereby modify the local contribution of the holes to the resistance.

It is important to note here that a HRVA is distinct from so-called diffuser plates; the main function of a diffuser plate is to distribute the flow of electrolyte, rather than to provide significant electrical resistance. As long as 1) the flow is relatively uniform, 2) the gap sufficiently large between the wafer holder and diffuser plane, and 3) the spacing between the wafer and anode is sufficiently large (e.g., for a non-movable anode), the relative gap between a low electrical resistance diffuser and the wafer will generally only have a minor impact on the current distribution when plating a high sheet resistance wafer.

In contrast, in the case of a one-dimensional HRVA, current is prevented from flowing radially by providing a large number of small through-holes, each having very small principal dimension (or diameter for circular holes). For example, HRVAs having about 6,000 to 12,000 perforations, with each perforation having a diameter of less than about 5 mm, e.g., less than about 4 mm, less than about 3 mm, or less than about 1 mm, are suitable resistive elements. The porosity value for suitable disks is generally about 1% to 5%. Such disks increase the resistance of the plating system by about 0.3 to 1.2 ohm or more, depending on the design and electrolyte conductivity. In contrast, diffuser plates generally have openings that constitute a much larger net porosity (in the range of from 25 to 80 percent open void fraction), no more than is required to achieve a substantially uniform electrolyte flow though a significant viscous flow resistance, and generally have a much smaller, often insignificant, overall contribution to resistance of the plating system.

While a HRVA (unlike a diffuser plate) may have substantial resistivity, in some implementations the HRVA is configured such that it does not increase the system total resistance by more than about 5 ohms. While a larger system total resistance may be used, this limitation is because excessive resistance will require increased power to be used, leading to undesirable heating of the electroplating system. Also, because of some practical limitations of manufacturability (i.e., creating a large number or exceedingly small diameter holes), performance (fewer holes leading to individual-hole current "imaging"), and loss of general process utility (e.g., inability to plate thicker films without wasted power, heat and bath degradation), about 5 ohms is a practical HRVA limitation.

Another parameter of a one-dimensional resistive element is the ratio of a through-hole diameter (or other principal dimension) to the distance of the element from the wafer. It was discovered experimentally and subsequently verified by computer modeling that this ratio may be approximately 1 or less (e.g., less than about 0.8, or less than about 0.25). In some implementations, this ratio is about 0.1 for providing good plating uniformity performance. In other words, the diameter of the through-hole should be equal to or smaller than the distance from the HRVA element to the wafer. In contrast, if the through-hole diameter is larger than the wafer-to-HRVA distance, the through-hole may leave its individual current image or "footprint" on the plated layer above it, thereby leading to small scale non-uniformity in the plating. The hole diameter values recited above refer to the diameter of the through-hole opening measured on the HRVA face that is proximate to the wafer. In many implementations, the through-hole diameter on both proximate and distal faces of HRVA is the same, but it is understood that holes can also be tapered.

The distribution of current at the wafer may also depend on uniformity of the hole distribution on the HRVA. Regarding hole distribution, the holes in a HRVA plate may be designed to be of the same size and are distributed substantially uniformly. However, in some cases, such an arrangement can lead to a center spike or dip in the plated film thickness, or a corrugated (wavy) pattern. Specifically, use of a HRVA having uniform distribution of holes in the center has resulted in center spikes of about 200 Å to 300 Å for 1 micrometer plated layer.

In one implementation, a non-uniform distribution of 1-D pores/holes in the central region of the HRVA may be used to prevent the center spikes. The central region of HRVA is defined by a circular region at the HRVA center, generally within about 1 inch radius from the center of HRVA disk, or within about 15% of the wafer radius. The non-uniform distribution of through-holes effective for spike reduction can have a variety of arrangements achieved by shifting holes, adding new holes, and/or blocking holes in an otherwise uniform pattern. Various non-uniform center hole patterns may be useful for avoiding plating non-uniformity and are described in U.S. patent application Ser. No. 12/291,356, filed Nov. 7, 2008, which is herein incorporated by reference.

Structure of the Auxiliary Cathode

The auxiliary cathode 350 may be located between the anode 120 and the ionically resistive ionically permeable element 301. The auxiliary cathode 350 may have may have its own electrolyte flow loop (not shown) and pump (not shown). Further details regarding configurations of the auxiliary cathode 350 are given in U.S. patent application Ser. No. 12/291,356, filed Nov. 7, 2008, and U.S. patent application Ser. No. 12/481,503, filed Jun. 9, 2009, which are herein incorporated by reference.

In some implementations, the auxiliary cathode includes multiple segments, where each of the segments can be separately powered by a separate power supply or using one power supply having multiple channels adapted to independently power segments of the second physical cathode. Such a segmented auxiliary cathode may be useful for plating on non-circular or asymmetrical wafers, such as wafers having flat regions; some wafers contain wafer "flats", a cut out arc of the wafer at the wafer edge, used, for example, for alignment. In general, however, a segmented auxiliary cathode having independently powered segments can be used with any kind of work piece (symmetrical or not), as it allows fine-tuning plating uniformity. Specifically, a segmented auxiliary cathode can be used for providing current corrections at different azimuthal positions of the wafer.

The auxiliary cathode segments can be located below, at the same level, or above the wafer, either in the same plating chamber as the wafer or in a different plating chamber in ionic communication with the main plating chamber. Any arrangement of the segments can be used, as long as the segments are aligned with different azimuthal positions about the wafer. The number of segments can vary depending on the needs of the process. In some implementations, about 2 to 10 segments are used.

One of the advantages of employing an auxiliary cathode for modulating the current directed at a wafer (over, for example, a moving mechanical shield or iris alone) is that the level of current applied to the auxiliary cathode can be rapidly and dynamically controlled during the plating process (e.g., times shorter than a few seconds) to account for rapidly changing metal sheet resistance as the metal is deposited. This aids in keeping the plating non-uniformity to a minimum during different times in the plating process. For example, the level of current applied to the auxiliary cathode can start at high level when the layer is thin, and then can be gradually or incrementally reduced during plating (e.g., over a period of a few seconds) as the thickness of the plated layer increases and the severity of the terminal effect subsides.

A HRVA and/or a second auxiliary cathode, positioned near the work piece, can influence the plating surface of the work piece and reshape the current distribution on a wafer by changing the voltage and current distribution only in a region in close proximity to the face of the work piece. These elements do not significantly impact the current distribution within the electrolyte or at the anode at a significant distance from the work piece surface, such as below the HRVA. Thus, these measures (using the HRVA and/or second auxiliary cathode located near the wafer or HRVA as described herein) have little or no impact on the current distribution closer to the anode which resides below the HRVA. In many cases, the ionic current distribution remains nearly constant in the region between the anode and the HRVA.

The HRVA alone generally will improve the long range radial current distribution over configurations without a HRVA (from less uniform to more uniform). However, without a specific radial-pore-pattern limited to the application over a thickness/sheet resistance range or a mechanically activated dynamic change in shielding, the radial current distribution generally tends to be less than perfectly uniform, generally center thin. A secondary auxiliary cathode, positioned above the HRVA, outside the gap created by the wafer substrate and the HRVA, and peripheral to the wafer edge, can dynamically influence the edge current distribution (typically limited to a region within about 1-3 cm from the edge), but not change the central plating region's current distribution. A movable shield positioned above the anode and below the HRVA also can help dynamically influence the current distribution in the plating chamber. However, for some applications, particularly situations where the sheet resistance is exceedingly large, using a HRVA and/or second auxiliary cathode and/or movable shield as described herein may be insufficient to fully overcome the terminal effect.

It may be necessary to modify the current distribution inside the electrolyte at positions well removed from the work piece, i.e., at a position relatively closer to the anode, to adequately address the terminal effect when very high resistance seed or seed/barrier combination layers are used. In certain embodiments described herein, this is accomplished by positioning an auxiliary cathode at a location below the HRVA and between the work piece and the anode. The auxiliary cathode is shaped and oriented to modify the current density distribution within the electrolyte in a plane parallel to the wafer, below the HRVA, and located some distance from the work piece in a manner that reduces the current density and current vector (flow direction) in regions of the plane below and corresponding to the edge regions of the work piece. This is similar to the on-wafer effect of a physical iris or shield placed below a work piece in a plating chamber. For this reason, the auxiliary electrodes of embodiments of this invention are sometimes referred to as "electronic irises", or an "EIRIS", because an electronic auxiliary electrode is used to accomplish a result similar to that of a physical iris such as a shield placed in the current path between the wafer and the anode. In the case an EIRIS, however, the current vector trajectory is shifted radially outwards, rather than being blocked at larger radii and being forced and squeezed inwards with a shield.

To elaborate, one difference between an EIRIS and a physical iris or shield is that all the current from the anode passes through the opening in the shield as it "squeezes through" the iris or shielding restriction. Current is largely or completely blocked by the shield and is re-routed from the edge regions radially inwards before passing upwards. As a result, the central current density in the region of the shield opening is generally increased. In the case of the EIRIS, not all the current emanating from the anode arrives at the wafer, as some of the edge current is generally diverted radially outwards towards the auxiliary electrode. Above the auxiliary cathode the magnitude of the current density vector directed at the wafer tends to be reduced because of the diversion, but the current density in the central region of an EIRIS-equipped electroplating apparatus above the EIRIS is only slightly decreased or perhaps unaltered vs. the non-EIRIS case.

The region where the auxiliary cathode acts is generally parallel to the substrate surface and separated therefrom. Generally, it is desirable to have the auxiliary cathode located relatively close to the lower surface of the HRVA so that the current does not have the space in which to redistribute to a more non-uniform profile before reaching the HRVA surface. In certain implementations, the distance, d, between the lower surface of the HRVA and the auxiliary cathode is approximately equal to or less than the radius, r, of wafer onto which metal is being plated (i.e., d~≤r). The auxiliary cathode should also be significantly above the plane of the anode so the current from the anode has space to change directions without unduly large auxiliary cathode voltages or currents.

Generally, the distance of the auxiliary cathode in the anode chamber and below the wafer and HRVA (when the system has a HRVA) should be kept to less than about 50% of the wafer diameter. For example, for a 300 mm wafer, the auxiliary cathode might be between about 0.75 to 6.5 inches below the wafer and between about 0.25 and 6 inches below a HRVA. In contrast, the location of the anode relative to the wafer, HRVA (when employed), and auxiliary cathode is a compromise between functional performance as well as engineering waste. Typically, the anode should generally be in the anode chamber and below all three of these elements. But while the electroplating apparatus might have the anode located far below the wafer, HRVA, and auxiliary electrode, for example, 40 inches below the wafer, such an electroplating apparatus, while it could be made to function, would require quite a bit of excess power.

As was already noted, the auxiliary cathode should be relatively close to the wafer or bottom surface of the HRVA. As way of a further example, if the auxiliary cathode was located 39 inches below the wafer with an anode 40 inches below the wafer (i.e., reasonably close to the plane of the anode and far from the bottom of the HRVA), most of the current from the anode would go to the EIRIS, but that which left the lower region of the electroplating apparatus anode chamber would have a great distance to travel before reaching the wafer. Over such a distance, the current would tend to equilibrate back to a different current distribution by the time it reached the HRVA and wafer, so the uniformity at the wafer would be largely unaffected by the existence of the EIRIS. Alternatively, if the anode were 0.75 inches from the wafer, 0.25 inches below the HRVA, and substantially parallel to or even above the EIRIS, the electroplating apparatus also would not work as well as when the anode were substantially below the EIRIS as described above, because the EIRIS would not be as effective in removing current from the more central regions of the cell. Therefore, in some embodiments, the distance of the physical anodes (or virtual anode mouth) surface closest to the wafer should be at last about $\frac{1}{10}$ the wafer diameter below the plane of the EIRIS electrode (or virtual EIRIS cavity mouth) closest to the wafer. For example, if the plane of the EIRIS electrodes closest point to a 300 mm wafer is 50 mm below the wafer and 25 mm below the HRVA, then the anode should be at least about 30 mm below that plane, or a total of 80 mm (30+50=80) below the wafer.

In the embodiments of FIGS. 3C-3F, the auxiliary cathode 350 is located below the HRVA. It is positioned in the anode chamber (i.e., either the diffusion chamber or the sealed anode chamber). In the embodiment shown in FIGS. 3C-3F, the auxiliary cathode is located above the cationic membrane, in the diffusion chamber 308. In the embodiment shown in FIGS. 3C-3F, auxiliary cathode 350 comprises physical cathode 339, housed in a chamber 341 with its own electrolyte flow circuit and pump (not shown). In some embodiments, the size of the auxiliary cathode (i.e., the height of the opening of the virtual cathode chamber) is about 5 to 15% (in certain embodiments, about 10%) of the radius of the wafer being plated. In FIGS. 3C-3F, electrolyte enters the auxiliary cathode chamber 341 at 351 and exits at 352. The auxiliary cathode chamber is separated from the diffusion chamber 308 by an ion-permeable membrane 344. A rigid framework may provide support for the membrane. The membrane 344 allows ionic communication between the diffusion chamber 308 and the auxiliary cathode chamber 341, thereby allowing the current to be diverted to the auxiliary cathode 350. The porosity of membrane 344 is such that it does not allow particulate material to cross from the auxiliary cathode chamber 341 to the diffusion chamber 308 and result in wafer contamination. In some embodiments, the ion-permeable membrane 344 is a cationic membrane, such as Nafion, and the membrane does not result in a significant ionic resistance (as compared, for example, element 349 described below). Other mechanisms for allowing fluidic and/or ionic communication between the auxiliary cathode chamber and the anode chamber are within the scope of this invention, including the ionic membranes and cationic membranes noted above. Examples include designs in which an impermeable wall, in addition to the membrane 344, provides some of the barrier between the electrolyte in the anode chamber and the electrolyte in the auxiliary cathode chamber.

In some embodiments, the physical cathode 339 associated with the auxiliary cathode 350 is an annularly shaped strip of metal located within the auxiliary cathode chamber 341. The physical cathode 339 is connected to a power supply 370 by, for example, a feed-through connector attached to an electrode cable (not shown). The metal composing the physical cathode 339 and its surface is preferably inert under electroplating conditions. Examples on inert metals which can be used as a physical cathode include tantalum, tungsten, titanium, palladium or platinum, a palladium or platinized metal substrate such as titanium or tungsten or tantalum, iridium, iridized titanium and the like. In some embodiments, the same material that is being plated as the physical cathode material is used. For example, a copper-comprising physical cathode may be used when copper is plated.

The dimensions of the auxiliary cathode chamber 341 and of the physical cathode 339 may vary depending on the needs of electroplating process. In some embodiments, the width of the physical cathode is about 10 to 20% (about 15% in certain embodiments) of the radius of the wafer being plated. In one embodiment, the physical cathode is a strip of metal, having a thickness of about 0.1 to 2 mm, a width of about 0.5 to 5 cm, and a length traversing the outer peripheral region of the anode chamber. Embodiments of other cathode configurations include circular bars (O-shaped toroids), C-shaped bars, coils having a circular configuration in which individual coils define a small circle and the overall coiled structure surrounds the main plating vessel in the auxiliary cathode or anode chamber.

While the auxiliary cathode chamber need not be restricted to a fractional volume, it is generally smaller than the anode chamber, having a volume of about 1 to 20% of the anode chamber, and in some embodiments, around 5%. As described above, it is generally desirable to have the auxiliary cathode located relatively close to the lower surface of the HRVA, so that the current does not have the space in which to redistribute before reaching the wafer surface. The distance, d, between the lower surface of the HRVA and the auxiliary cathode should generally be about equal to or less than the radius, r, of wafer onto which metal is being plated (i.e., d~≤r). In embodiments where a HRVA is not employed, the distance, d, between the wafer and the auxiliary cathode should generally be about equal to or less than 1.3 times the radius, r, of the wafer onto which metal is being plated (i.e., d~≤1.3r). The auxiliary cathode should also be significantly above the plane of the anode so the current from the anode has space to change directions without unduly large auxiliary cathode voltages or currents.

In further embodiments, a high ionically resistive porous membrane 349, generally similar in construction to that of the HRVA itself, though not requiring particularly small or numerous holes, is positioned between the auxiliary cathode chamber and the anode chamber. Such a membrane serves to shape the current distribution to the sides of the electroplating cell, making it more uniform. A membrane for this purpose typically has between about 1 to 5% porosity. It may or may not include small one-dimensional holes. The resistance of the membrane 349 in this function is generally commensurate with the resistance of the HRVA 301 in front of the wafer, improving the current distribution uniformity to the auxiliary electrode, as well as making the current at the virtual auxiliary electrode mouth more uniform/consistent. In certain embodiments, the high ionically resistive porous membrane 349 is less than about 25 mm thick, and preferably about 12.5 mm thick. Exemplary hole diameter sizes in membrane 349 are between about 1 and 10 mm. Slots or other openings can also be used.

In some cases, when using an auxiliary cathode located below a plating substrate in an electroplating apparatus, it may be desirable not to use a HRVA. For example, such a HRVA-free system might be sued when the wafer's sheet resistance is not greater than about 5 ohm per square. In some cases, the auxiliary cathode alone (preferably, but not necessarily, in combination with a second auxiliary cathode located above the anode chamber and peripheral to the wafer holder, described in more detail below) may be capable of improving the uniformity of the current density experienced by the wafer to a sufficient level without the additional cost and complexity of an HRVA.

The second auxiliary cathode 348 is located outside the anode chamber, outside of the HRVA-to-wafer gap 316, and outside of the peripheral gap 317. As noted above, the second auxiliary cathode in the embodiment shown in FIGS. 3B-3F is a virtual cathode. The second auxiliary cathode, similar to the auxiliary cathode, has an associated second physical cathode 360, a chamber 343 and may contain its own electrolyte flow loop, pump (not shown), and cationic membrane 346, as shown in FIGS. 3C-3F. In FIGS. 3C-3F, electrolyte enters the chamber 343 at 354 and exits at 356. The cationic membrane 346 allows ionic communication between the second auxiliary cathode chamber and the plating cell, while preventing any particles generated at the second auxiliary cathode from entering into the plating chamber. Further details regarding the configuration of the second auxiliary cathode are given in U.S. application Ser. No. 12/291,356 filed Nov. 7, 2008, previously incorporated by reference.

In some embodiments, the second physical cathode of the second auxiliary cathode includes multiple segments, where each of the segments can be separately powered by a separate power supply or using one power supply having multiple channels adapted to independently power segments of the second physical cathode. Such a segmented second physical cathode is particularly useful for plating on non-circular or asymmetrical wafers, such as wafers having flat regions. While fairly uncommon today, some wafers contain wafer "flats", a cut out arc of the wafer at the wafer edge, used, for example, for alignment. In general, however, a segmented second physical cathode having independently powered segments can be used with any kind of workpiece (symmetrical or not), as it allows fine-tuning plating uniformity. Specifically, a segmented second physical cathode can be used for providing current corrections at different azimuthal positions of the wafer.

Because current density at the wafer flat region will generally be different than the current density at the circular regions of the wafer, a different amount of current needs to be diverted from the wafer flat part as compared from the other parts. Accordingly, in one embodiment, the second physical cathode segments are powered in concert with wafer rotation, such that a first level of current is supplied to the segments aligned with the wafer flat region, while a second level of current is supplied to the second physical cathode segments aligned with the circular portions of the wafer.

The second physical cathode segments can be located below, at the same level, or above the wafer, either in the same plating chamber as the wafer or in a different plating chamber in ionic communication with the main plating chamber. Any arrangement of the segments can be used, as long as the segments are aligned with different azimuthal positions about the wafer. The number of segments can vary depending on the needs of the process. In some embodiments between about 2-10 segments are used.

While a multi-segmented second physical cathode of a second auxiliary cathode is particularly useful with a 1-D HRVA disposed in close proximity of the wafer, as was described above, this is a separate embodiment which can be used both independently and in combination with various plating apparatus features disclosed herein.

Virtual Electrode

Two types of current source (or sink) electrodes should be recognized in a plating apparatus as described herein: a virtual electrode and a physical electrode. Both types of electrodes provide either current sources (anodes) or current sinks (cathodes).

Physical electrodes are commonly known as electrochemical interfaces, typically composed of a conductive material such as a metal (e.g. copper) that are solid (or in some circumstances a liquid when using a conductive liquids such as mercury) physical structures where an electrochemical reaction takes place at the electrolyte interface. An example of a physical electrode is a piece of copper where copper electrodeposition or oxidation takes place. These physical conductive anodes or cathodes, disposed within an electrolyte of an electroplating chamber, can have various dimensions and can be located as desired anywhere within an electroplating chamber, either inside or outside an anode chamber as described herein, above, below or to the side of a plating substrate or HRVA plate depending on the type of electrode and its desired function. While the physical electrode has a finite size (depth), when the electrode is non-porous (e.g. as a solid piece of metal), the influence of the physical electrodes on the reaction current distribution is generally limited primarily to the surface contour of the electrode exposed to the electrolyte within the chamber.

A virtual electrode has an associated physical electrode that is located at a position removed from that of the virtual electrode. In other words, the positions of the virtual electrode and its associated physical electrode are separated by some distance. However, the virtual electrode is in ionically conductive communication with its associated physical electrode. In addition to its physical electrode, a virtual electrode is defined by an insulating or highly resistive cavity structure which constrains the current and current distribution associated with the physical electrode. Such structure is typically in contact with the electroplating solution. Without the insulating or highly ionically resistive structure, the current distribution from the physical electrode could be significantly more non-uniform at the location of the virtual electrode. A typical insulating structure is a focusing tube or focusing cavity that surrounds the physical electrode in all directions except for an opening or mouth to a larger region of the plating chamber (e.g., an opening to the main part of the chamber). The effective location of the virtual electrode in such designs is the virtual electrode's mouth (i.e., the position where the cavity or other containment structure opens into a larger region of the plating vessel such as the region that contains the work piece being electroplated). An example of a virtual cathode defined by a cavity in an insulating structure is shown as element 348 in FIG. 3B, where the associated physical cathode is shown as element 360. An example of a virtual anode formed by a cavity and a highly ionically resistive structure is the high resistance virtual anode (HRVA) shown as element 301 in FIG. 3A, and associated with anode 315. Other virtual anodes are discussed in U.S. patent application Ser. No. 11/040,359, filed Jan. 20, 2005, which is incorporated herein by reference for all purposes.

Often a virtual electrode can be characterized by three elements: 1) a physical electrode, 2) a dielectric housing cavity containing ionic conductive electrolyte that confines the manner in which the ionic current flows to or from the physical electrode and 3) one or more cavity mouth(s). As indicated, the dielectric housing cavity structure essentially allows one to confine, direct, and/or focus the current delivered to, or emanating from, the cavity though the virtual electrode cavity mouth(s). Generally, the location of the associated physical electrode within the virtual electrode cavity allows the physical electrode influence to be substantially removed from the electrode's physical location and transposed to the virtual electrode's location.

In certain embodiments, the physical electrode within a virtual electrode cavity is located behind or below a membrane, such as a cationic conductive membrane. Such membrane may serve the purpose of limiting the physical electrode's exposure to plating bath additives, and/or preventing particles generated at the physical electrode from entering the main electrode chamber or traveling to the wafer surface. In some embodiments, the mouth of the virtual electrode cavity contains a high resistance porous dielectric element (a so called high resistance virtual anode or cathode plate). The inclusion of such a plate substantially increases the voltage drop therein, and allows the mouth of the virtual electrode to more closely approximate a uniform current source, which in some cases can increase the radial effectiveness of the virtual electrode and create a more uniform wafer current at a lower total auxiliary electrode current.

The non-conductive virtual electrode cavity structures (e.g. plastic walls) direct all or substantially all of the current coming from or going to the physical electrode that is housed internally in the virtual electrode cavity to emanate from or enter into the virtual electrode cavity mouth. The potential at the surface of a conductive physical electrode is typically approximately a single constant value. This condition may be, but is not necessarily, approximated at the virtual cavity mouth. It is understood that it is not necessary for the virtual cavity mouth to have all the properties of, or result in an identical current distribution at the virtual cathode/anodes mouth location that would occur if a physical electrode where located there. However, all current from the physical electrode must pass though the cavity mouth(s), and when the electrode, cavity, resistive element and other components are appropriately designed, both the potential and current distribution across the virtual electrode can be made to be substantially uniform. For example, the shape of the cavity can be modified to improve the uniformity of plating on the physical cathode. The virtual electrode mouth region is typically, though not necessarily, planar, annular, or conical, though other shapes are certainly possible. For many purposes, the virtual electrode mouth appears to act like a "real" physical electrode because it presents a surface where current passes into or out of a major cell element (e.g. main anode chamber). As indicated, this cavity mouth "surface" influences plating conditions by providing or consuming ionic current in the similar manner that a physical electrode would if the physical electrode were located at the position of the virtual electrode mouth.

Power Supplies for the Electroplating Apparatus

Figure 3D:
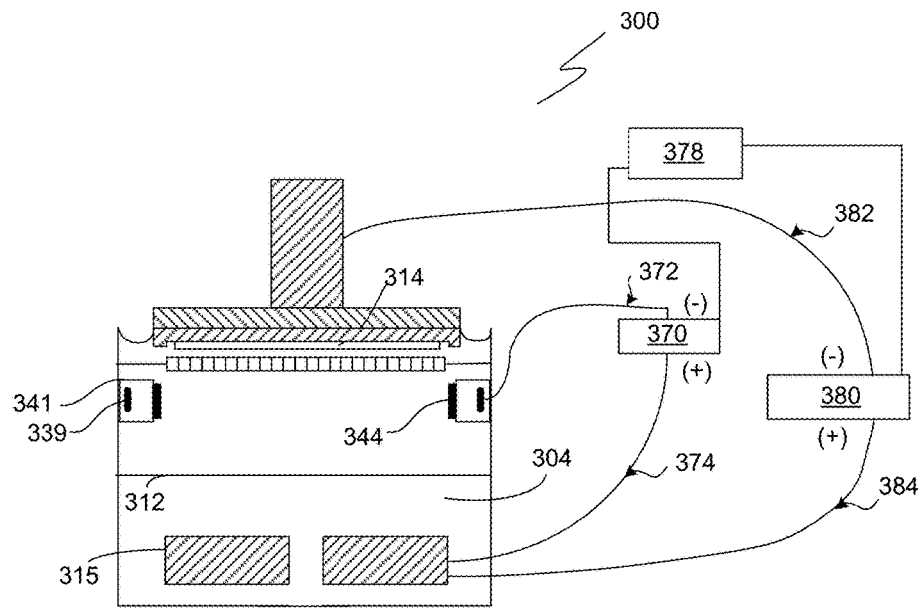
Figure 3E:
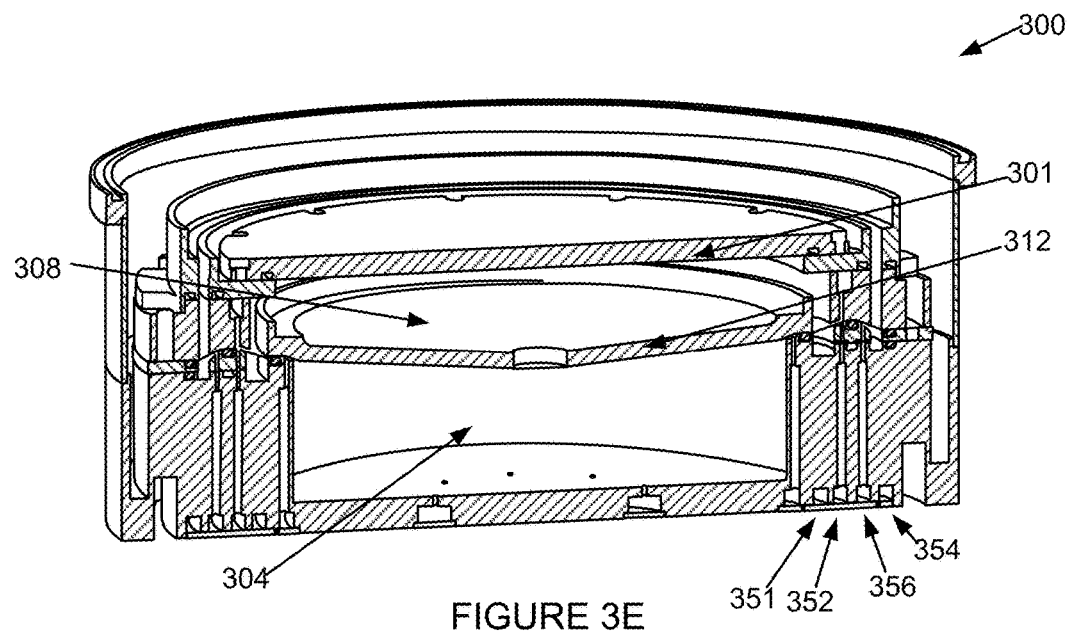
Figure 3F:
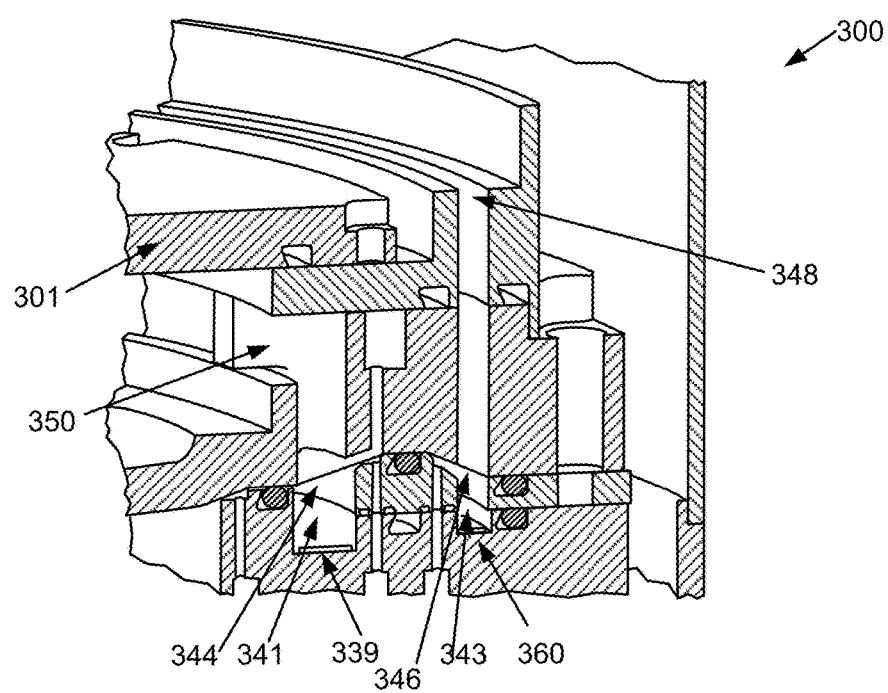

In certain embodiments, one or more power supplies are provided for the work piece and the one or more auxiliary cathodes. In some cases, a separate power supply is provided for each auxiliary cathode and the work piece; this allows flexible and independent control over delivery of power to each cathode. In the embodiment depicted in FIGS. 3C-3F, three DC power supplies are used for controlling current flow to the wafer 314, to physical cathode 339 (associated with auxiliary cathode 350), and to physical cathode 360 (associated with second auxiliary cathode 348). In FIG. 3D, only two power supplies, one for wafer 314 and one for physical cathode 339, are shown for the sake of clarity. The power supply 380 has a negative output lead 382 electrically connected to wafer 114 through, e.g., one or more slip rings, brushes and/or contacts (not shown). The positive output lead 384 of power supply 380 is electrically connected to an anode 315 located in the separated anode chamber 304. Similarly, a power supply 370 has a negative output lead 372 electrically connected to the physical cathode 339, and a positive output lead 374 electrically connected to anode 315. Alternatively, one power supply with multiple independently controllable electrical outlets can be used to provide different levels of current to the wafer and to the auxiliary cathode. The power supplies 380 and 370 can be connected to a controller 378, which allows for independent control of current and potential provided to the wafer and auxiliary cathode of the electroplating apparatus. The second physical cathode (not shown in FIG. 3D) is connected to a power supply (not shown) in a similar matter to the physical cathode.

During use, the power supplies 380 and 370 bias the wafer 314 and the physical cathode 339, respectively, to have a negative potential relative to anode 315. Power supply 380 causes an electrical current to flow from anode 315 to wafer 314, plating metal onto the wafer. Power supply 370 causes the electrical current flowing from anode 315 to wafer 314 to be partially or substantially diverted to auxiliary cathode 350. The electrical circuit described above may also include one or several diodes (not shown) that will prevent reversal of the current flow, when such reversal is not desired. An undesired current feedback may occur during plating, since the anode 315 which is set at ground potential is the common element of both the wafer and the auxiliary circuits. A power supply for the second auxiliary cathode operates in a similar manner.

With separate power supplies for both the auxiliary cathode and the second auxiliary cathode, the current applied to each of the cathodes may be dynamically controlled. As a wafer is electroplated with metal, the sheet resistance decreases and the current non-uniformity may be reduced, making the auxiliary cathode unnecessary after a certain thickness of metal is achieved. The current supplied to the auxiliary cathode may be dynamically controlled to account for a reduction of the wafer's sheet resistance and the associated more uniform current distribution that normally results without the activation of the auxiliary electrode. In some embodiments, no current is supplied to the auxiliary cathode after the sheet resistance of the wafer drops to a defined level such as about 1 ohm per square or lower.

Good plating uniformity can be achieved with an appropriately designed HRVA for sheet resistances below about ½ ohm per square. Therefore, the EIRIS current can be essentially reduced to near zero below this resistance value. More generally, if the plating process is started with a film having a sheet resistance of 100 ohm or more per square, for example, the EIRIS current can be significantly reduced once the sheet resistance drops below about 20 ohm per square, more preferably or more extensively when the resistance drops below 10 ohms per square. As noted above, EIRIS current generally is not required at values below ½ ohm per square. If the film being plated is copper, these sheet resistances approximately correspond to thicknesses less than 15 Å (100 ohm per square), 50 Å (20 ohm per square), 100 Å (10 ohm per square) and 500 Å (0.5 ohm per square) of copper on the wafer In yet further embodiments, depending on the current density applied to the wafer, and therefore the rate of reduction of the wafer sheet resistance, no current or substantially no current is supplied to the auxiliary cathode after metal is plated onto the wafer for a set duration such as a period of about 20 seconds or less, or in other embodiments for a period of about 5 to 6 seconds or less.

The current may be reduced to the auxiliary cathode and/or the second auxiliary cathode simply by turning off the current supplied to each cathode. The current may also be constant for a period of time and then decrease monotonically, or alternatively decrease monotonically starting from when the electroplating process is initiated, or from a time shortly thereafter. The current supplied to the second auxiliary cathode may also be dynamically controlled in a manner that is driven by and in some manner follows (e.g. is made to match proportionately) the auxiliary cathode current. One or both of the auxiliary electrode currents can be tied or otherwise manipulated dynamically in a proportionate manner to the total wafer current. The current supplied to the auxiliary (and/or second auxiliary cathode) may also be dynamically controlled in a manner using an algorithm calculated from and/or time shifted from (e.g. initiation delayed until reaching a threshold trigger current level or time since initiation of plating) the current flowing through the wafer, anode or auxiliary cathode. The current supplied to the auxiliary cathode and the second auxiliary cathode does not need to be decreased in the same manner or at the same rate. The current supplied to any of the wafer, anode, auxiliary and secondary electrode may also be pulsed. The pulse can be simple current on/off pulses with symmetric or different duration of on and off times. Alternatively, current forward and reverse pulses of different magnitudes and durations may be used. Control of the current supplied to one or more auxiliary electrodes is described in U.S. Pat. No. 6,168,693 issued to Uzoh et al., which is herein incorporated by reference in its entirety and for all purposes.

In one embodiment, the auxiliary and secondary cathodes are tied together with a resistor in the line of one of them after an in-line-tee split, the line coming from a single power supply that is used to energize both cathodes simultaneously. In other embodiments, separate power supplies for both the auxiliary cathode and the second auxiliary cathode are employed and allow for different current levels at different times for each of the cathodes. In a specific embodiment, when current is initially supplied to the auxiliary cathode, the ratio of the current supplied to the auxiliary cathode and to the substrate is at least about 1:2 (i.e. half of the total wafer current), and in a further specific embodiment is at least about 5:1 (i.e. five times the total wafer current). The current supplied to the second auxiliary cathode is typically about 10% of the current supplied to the wafer (i.e., 1:10). Current levels for the second auxiliary cathode are described in more detail in U.S. application Ser. No. 12/291,356, which was previously incorporated by reference.

An example of one possible current-time profile for an electrodeposition process is described below. When the electrodeposition process is first started for a 300 mm wafer, a 5 A current may be supplied to the wafer, a 25 A current may be supplied to the auxiliary cathode, and a 0.5 A current may be supplied to the second auxiliary cathode. After a 5 second time period has passed, the current supplied to the auxiliary cathode is ramped down in a linear fashion from 25 amps to 0 A over an ensuing 10 second time period, while keeping a constant 5 A current and 0.5 A current supplied to the wafer and the second auxiliary cathode, respectively. After a total of 20 seconds have passed, the current to the secondary cathode is turned off (set to zero). In this case, for the first 5 seconds, 30.5 Amps is supplied from the anode. From 5 to 15 seconds, the current from the anode decreases from 30.5 to 5.5 Amps. After 20 seconds the current to the anode drops to 5 amps and only the current from the anode to the wafer remains.

An alternative example of a possible electrodeposition process may be described by the following parameters. At the initial stage of the electrodeposition process for a 450 mm wafer, the sheet resistance of the substrate surface may exceed 3 ohms/sq. The auxiliary cathode and the secondary auxiliary cathode are both turned on at a level of maximum current. The auxiliary cathode may be supplied with a current of approximately 1 to 40 A, while the secondary auxiliary cathode may be supplied with a current of approximately 1 to 25 A. As the surface of the substrate becomes more conductive, for example when the sheet resistance of the substrate surface is less than 3 ohm/sq but greater than 0.5 ohm/sq, or alternatively after a period of about 6 seconds, the auxiliary cathode is turned off and the movable shield begins moving from its upper position to its lower position at a rate of approximately 6 to 8 mm/s. Once the movable shield reaches its lower position, the sheet resistance of the surface of the substrate is much lower, for example less than about 0.5 ohm/sq. At this point, the secondary auxiliary cathode is turned off and the electroplating completes.

It is understood that the best profile for a given circumstance depends on numerous factors such as the initial wafer sheet resistance, the plated film specific resistivity, the plating bath conductivity, plating bath additive influences, flow of the plating bath, as well as other factors associated with the physical cell design, so no one current-time profile is suitable for all cases. The optimum current-time profile therefore is best determined experimentally or estimated mathematically (i.e. using a computer model).

Controller 378 in conjunction with power supplies 380 and 370 allows for independent control of current and potential provided to the wafer, the auxiliary cathode, and the second auxiliary cathode of the electroplating apparatus, as well as the position of the movable shield. Thus, controller 378 is capable of controlling power supplies 380 and 370 to generate the current profiles described above. The controller, however, generally is not capable of independently determining if one of the conditions described above (e.g., sheet resistance reaching a level of 1 ohm per square or lower) has been met, though an estimate of the sheet resistance can be made based on a known total cumulative amount of charge passed to the wafer though lead 382 at any given time. Thus, the controller may be used in conjunction with sensors that may determine whether a condition has been met. Alternatively, the controller may simply be programmed with a separate current versus time profile for each of the wafer, auxiliary cathode, and second auxiliary cathode. The controller may also measure the charge (coulombs=integral of amperage*time) supplied to the wafer, auxiliary cathode, and second auxiliary cathode, and base the current-time profile on these data.

Controller 378 may be configured to control electrical power delivered to the auxiliary cathode in a manner that produces a more uniform current distribution from the anode after electroplating a defined amount of metal onto the substrate or after electroplating for a defined period of time. Controller 378 may also be configured to control electrical power delivered to a second auxiliary cathode adapted for diverting a portion of ionic current from an edge region of the substrate. Furthermore, controller 378 may be configured to ramp down electrical power delivered to the auxiliary cathode and the second auxiliary cathode, each at different rates, as metal is deposited on the substrate. Additionally, controller 378 may be configured to supply no current or substantially no current to the auxiliary cathode after the sheet resistance of the substrate surface reaches a first threshold level, and to supply no current or substantially no current to the secondary auxiliary cathode after the sheet resistance of the substrate surface reaches a second threshold level. The first threshold level for sheet resistance of the substrate surface may be between about 2 and 5 ohms/sq. The second threshold level may be between about 0.3 and 1 ohm/sq, for example 0.5 ohm/sq.

Controller 378 may also be configured to control the level of current supplied to the auxiliary cathode and to the substrate. In one embodiment, the ratio of current supplied to the auxiliary cathode and the substrate is at least about 1:2 when the current plating begins. In another embodiment, the ratio of current supplied to the auxiliary cathode and the substrate is at least about 5:1 when the current plating begins.

Controller 378 may be further designed or configured to control the position of the movable shield. The position of the movable shield may be controlled based on a number of factors including, but not limited to, the sheet resistance of the substrate surface, time (i.e. how long the electrodeposition process has been going), and the amount of metal deposited onto the substrate surface. These factors allow for dynamic control of the shield position, resulting in more uniform deposition across the wafer. In some implementations, the controller operates to ensure that the movable shield begins the electrodeposition process at its upper position, then allows the movable shield to move to its lower position at a rate of about 6-8 mm/s after the sheet resistance of the substrate surface reaches a certain level. In one embodiment, the controller is configured to cause the shield to begin moving when the sheet resistance of the substrate surface reaches approximately 3 ohm/sq. In other embodiments, the controller causes the shield to begin moving after a defined period of time, for example after 6 seconds of electrodeposition. In yet other embodiments, the controller causes the shield to begin moving after a defined amount of metal is plated onto the substrate. The controller may cause the movable shield to move at a constant or non-constant rate, as described above.

Method

Figure 5:
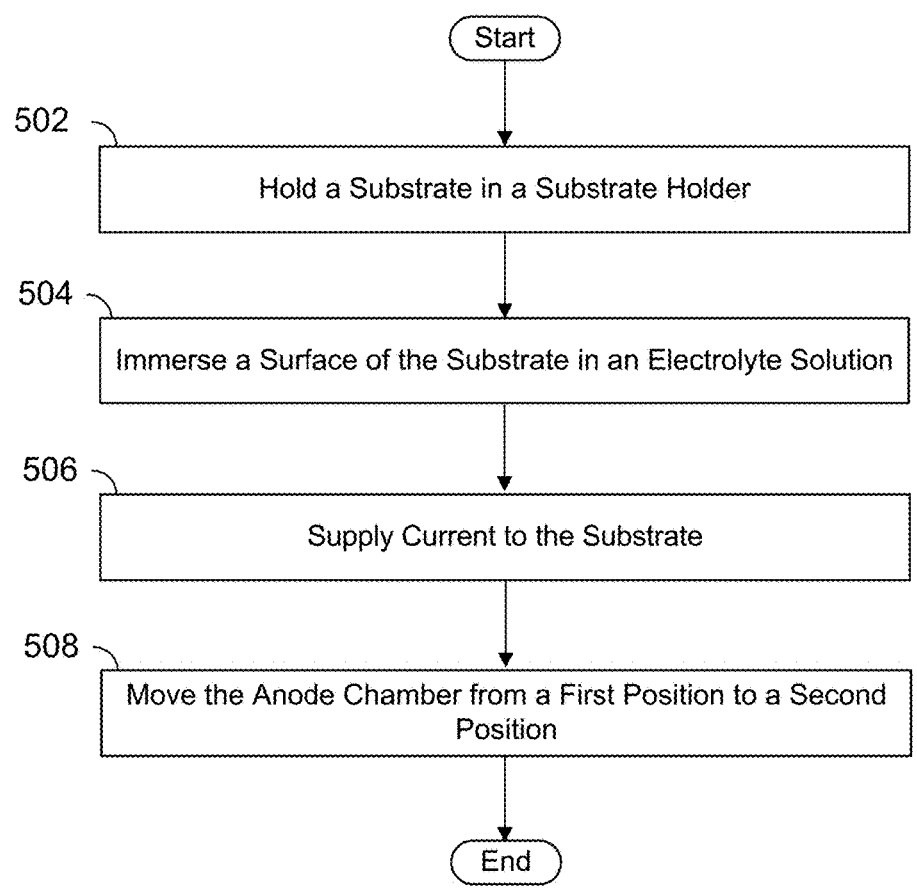
FIGS. 5 and 6A-6B show examples of flow diagrams illustrating processes for plating a metal onto a wafer substrate.
Figure 6A:
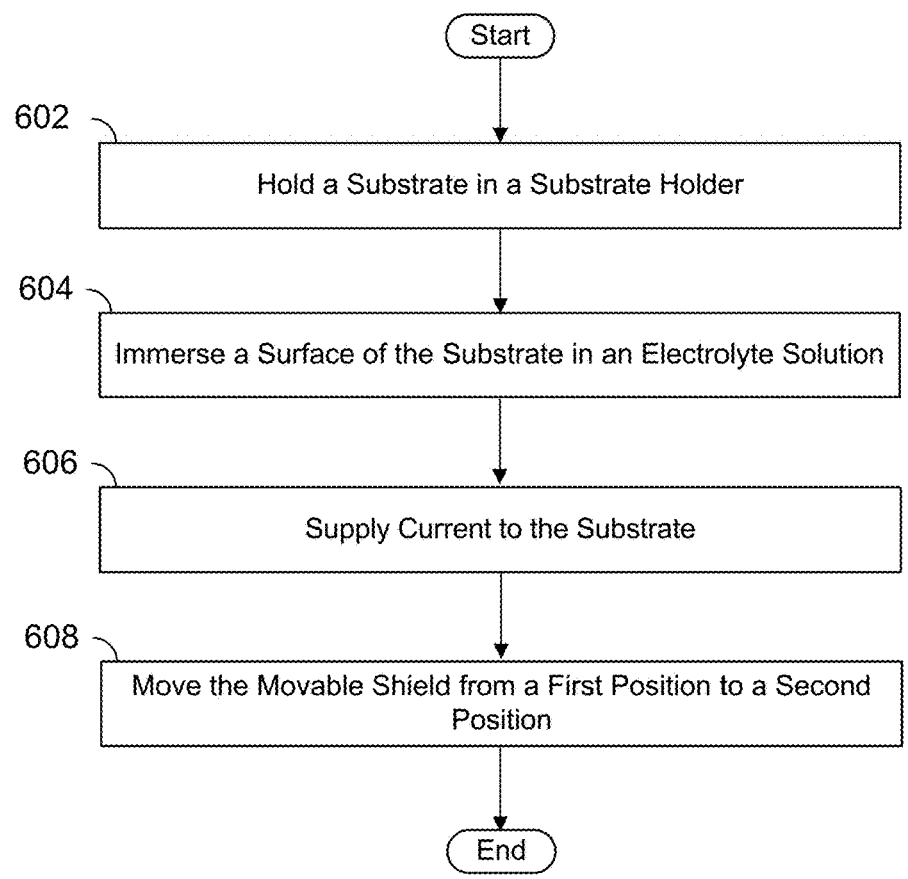
Figure 6B:
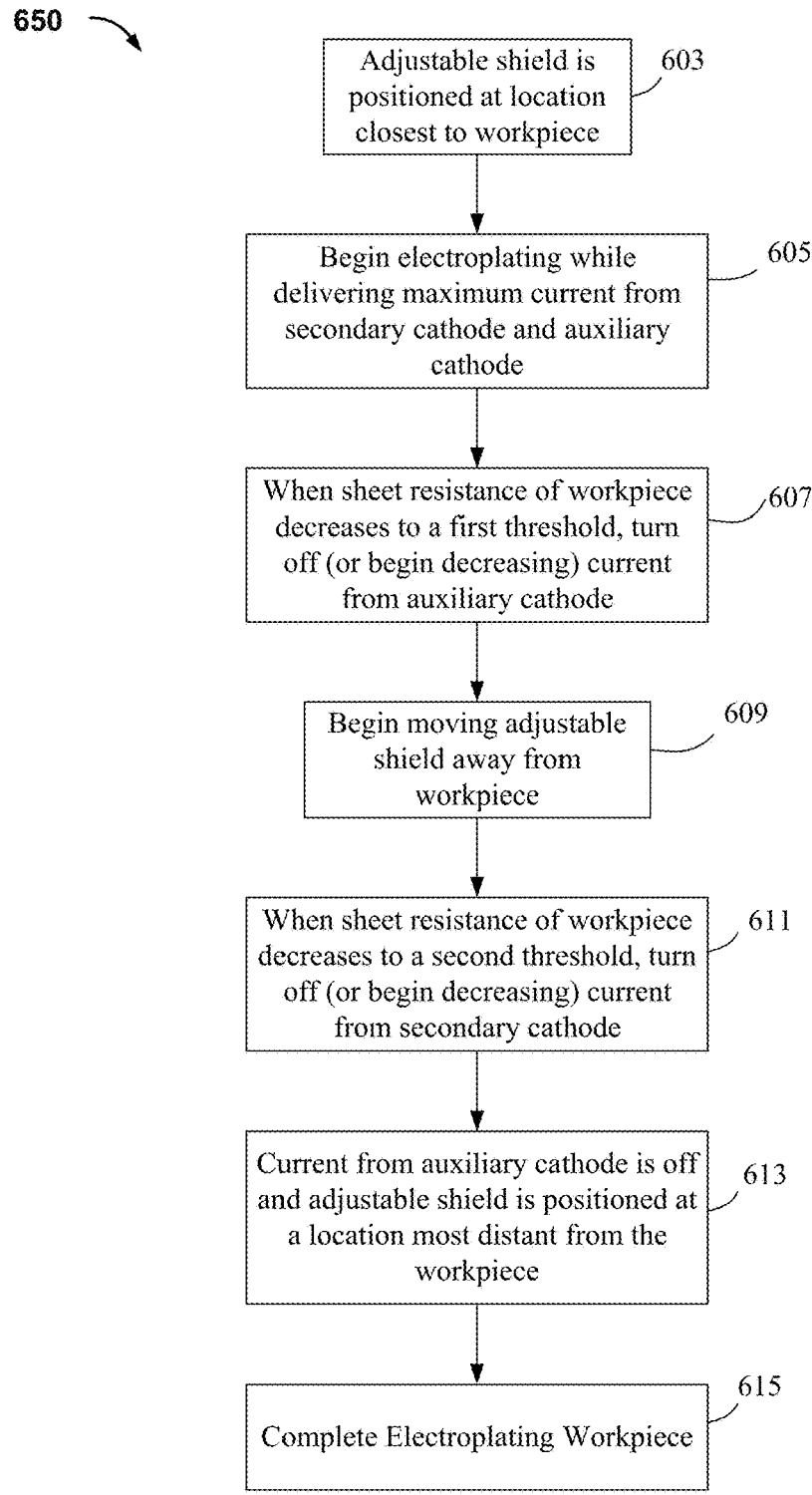

FIGS. 5 and 6A-6B show examples of flow diagrams illustrating processes for plating a metal onto a wafer substrate. The process shown in FIG. 5 may be performed on the electroplating apparatus 100 shown in FIGS. 1A, 1B, and 2, for example. The process shown in FIG. 6A may be performed on the electroplating apparatus 300 shown in FIG. 3A, for example. The process shown in FIG. 6B may be performed on the electroplating apparatus 300 shown in FIG. 3B, for example.

The process 500 shown in FIG. 5 begins at block 502. At block 502, a substrate having a conductive seed and/or barrier layer disposed on its surface is held in a substrate holder of an apparatus. The apparatus may include a plating chamber and an anode chamber housing an anode with the plating chamber containing the anode chamber. The anode chamber may include an insulating shield oriented between the anode and an ionically resistive ionically permeable element with an opening in a central region of the insulating shield.

At block 504, the surface of the substrate is immersed in an electrolyte solution and proximate to the ionically resistive ionically permeable element positioned between the surface and the anode chamber. The electrolyte may be a plating solution for plating copper onto the substrate, for example. The ionically resistive ionically permeable element may have a flat surface that is parallel to and separated from the surface of the substrate.

At block 506, current is supplied to the substrate to plate a metal layer onto the seed and/or barrier layer. At block 508, the anode chamber is moved from a first position to a second position, with the second position being located a distance further away from the ionically resistive ionically permeable element than the first position. Moving the anode chamber from the first position to the second position may aid in obtaining a uniform current density across the surface of the substrate as metal is plated onto the seed and/or barrier layer. For example, a sheet resistance of the substrate having a conductive seed and/or barrier may be about 50 Ohms/square to about 5 Ohms/square or about 50 Ohms/square to 10 Ohms/square when the anode chamber is in the first position. As metal is plated onto the conductive seed and/or barrier, the anode chamber may be moved in a linear manner with time to the second position. In some implementations, the position of the anode chamber may be dynamically controlled during plating to account for a reduction of the voltage decrease from the edge to the center of the substrate as metal is plated onto the substrate.

Some of the operations disclosed herein are triggered by or performed under certain values of sheet resistance. In some embodiments, the sheet resistance of the conductive layer on the workpiece is measured in situ during the deposition process. In some embodiments, the sheet resistance of the layer is predicted or calculated by modeling or empirical techniques. In the latter case, a controller or power supply may be appropriately configured to undertake method operations after a certain time or number of coulombs passed or other independent parameter associated with a particular change in sheet resistance.

In some implementations, the chamber may include an auxiliary cathode located between the anode and the ionically resistive ionically permeable element. Current may be supplied to the auxiliary cathode to shape the current distribution from the anode and divert a portion of ionic current from an edge region of the substrate.

Turning to FIG. 6A, the process 600 shown in FIG. 6A begins at block 602. At block 602, a substrate having a conductive seed and/or barrier layer disposed on its surface is held in a substrate holder of an apparatus. The apparatus may include a plating chamber and an anode. The plating chamber may include a movable shield. The movable shield may be oriented between the anode and an ionically resistive ionically permeable element with an opening in a central region of the movable shield.

At block 604, the surface of the substrate is immersed in an electrolyte solution and proximate to the ionically resistive ionically permeable element positioned between the surface and the anode chamber. The electrolyte may be a plating solution for plating copper onto the substrate, for example. The ionically resistive ionically permeable element may have a flat surface that is parallel to and separated from the surface of the substrate.

At block 606, current is supplied to the substrate to plate a metal layer onto the seed and/or barrier layer. At block 608, the movable shield is moved from a first position to a second position, with the second position being located a distance further away from the ionically resistive ionically permeable element than the first position. Moving the movable shield from the first position to the second position may aid in obtaining a uniform current density across the surface of the substrate as metal is plated onto the seed and/or barrier layer. For example, a sheet resistance of the substrate having a conductive seed and/or barrier may be about 50 Ohms/square to 5 Ohms/square or about 50 Ohms/square to 10 Ohms/square when the movable shield is in the first position. As metal is plated onto the conductive seed and/or barrier, the movable shield may be moved in a linear manner with time to the second position. In some implementations, the position of the movable shield may be dynamically controlled during plating to account for a reduction of the voltage decrease from the edge to the center of the substrate as metal is plated onto the substrate.

Next, looking to FIG. 6B, the process 650 begins at block 603. The movable shield is positioned at a location closest to the workpiece. The movable shield may be located about 5 millimeters to 15 millimeters below the cationic membrane, for example 10 millimeters. At block 605, electroplating begins while maximum currents are delivered to the auxiliary cathode and secondary auxiliary cathode. In certain implementations, the maximum current applied to the auxiliary cathode may be about 5 to 40 Amps, while the maximum current applied to the secondary auxiliary cathode may be about 5 to 20 Amps.

At block 607, when the sheet resistance of the workpiece decreases to a first threshold, the current to the auxiliary cathode begins to decrease or is turned off. For example, in some implementations, the current to the auxiliary cathode is turned off when the sheet resistance of the substrate surface reaches about 2 to 5 ohms/square, for example 3 ohms/square. In certain cases, the auxiliary cathode is supplied with current for approximately 6 seconds.

At block 609, the movable shield is moved away from the workpiece. In some embodiments, operation 609 may occur before operation 607. The movable shield may move away from the workpiece at a rate of about 5 to 10 millimeters per second, for example 6 to 8 millimeters per second. At block 611, when the sheet resistance of the workpiece decreases to a second threshold, the current to the secondary auxiliary cathode begins to decrease or is turned off. For example, the current to the secondary cathode may begin to decrease or be turned off when the sheet resistance of the substrate surface reaches 0.3 to 1 ohms/square.

At block 613, the current from the auxiliary cathode is turned off or at a minimal level, and the movable shield is positioned at a location most distant from the workpiece. In certain embodiments, the movable shield reaches its final position before the current to the secondary auxiliary cathode decreases or is turned off. In other embodiments, the current to the secondary auxiliary cathode begins to decrease or is turned off before the movable shield reaches its final position. In some implementations, the shield reaches its final location when the sheet resistance of the substrate surface is about or below 0.5 ohm/sq. The location of the movable shield in block 613 may be about 75 millimeters to 120 millimeters farther from the substrate than before the movable shield began moving in block 609. Finally, in block 615, the electroplating process completes.

In some implementations, the movable shield may include two insulating disks. Each of the insulating disks may include an opening in a central region of each disk and further include a plurality of holes in each disk. When the movable shield is in the first position, electrolyte may not be able to flow though the plurality of holes. As the movable shield moves from the first position to the second position, the orientation of the first and the second disk may change such that electrolyte is able to flow though the plurality of holes. The first and the second insulating disks of a movable shield operating in this manner may aid in obtaining a uniform current density across the surface of the substrate as metal is plated onto the seed and/or barrier layer.

In some implementations, the chamber may include an auxiliary cathode located between the anode and the ionically resistive ionically permeable element. Current may be dynamically supplied to the auxiliary cathode to shape the current distribution from the anode. Some implementations may further include a secondary auxiliary cathode located in substantially the same plane as the substrate. Current may be dynamically supplied to the secondary auxiliary substrate to divert a portion of ionic current from an edge region of the substrate.

Numerical Modeling

FIGS. 7-10 show examples of numerical simulations of the current density versus the radial position on a wafer substrate for different electroplating chamber configurations. These numerical simulations were performed to quantify and verify the capability of the movable anode chamber disclosed herein relative to other hardware configurations. A finite element model (using the commercial software Flex-PDE™) was used for the simulations. In most cases, the model was used to predict the capability of the plating cell to generate a uniform initial current distribution on a 50 Ohms/square seed layer on a 450 mm wafer substrate.

Figure 7:
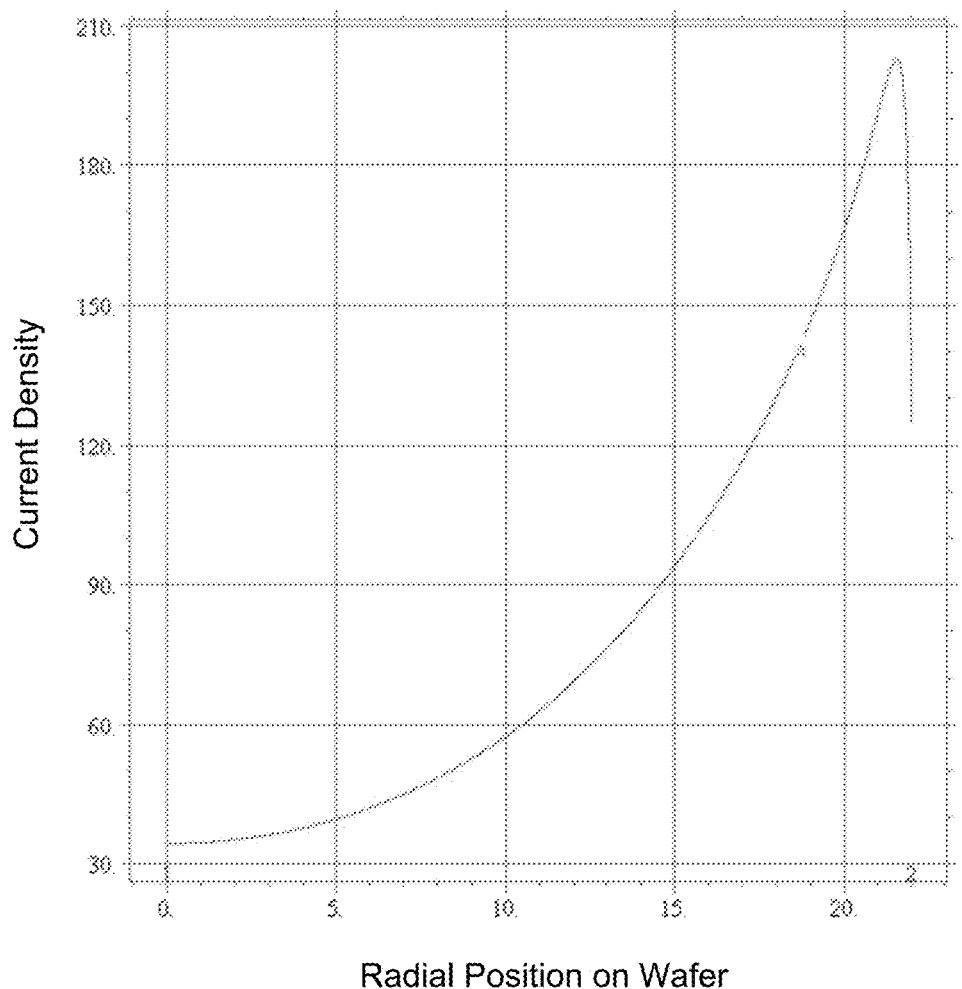
FIGS. 7-10 show examples of numerical simulations of the current density versus the radial position on a wafer for different electroplating chamber configurations.

FIG. 7 shows the current density versus radial position on the wafer substrate (i.e., 0 being the wafer substrate center and 225 being the wafer substrate edge) for a plating cell using a HRVA, an auxiliary cathode and a secondary auxiliary cathode. Auxiliary and secondary auxiliary cathode configurations are further described in U.S. patent application Ser. Nos. 12/481,503 and 12/606,030, both of which are herein incorporated by reference. Such a plating cell configuration may be used in the processing of 300 mm wafer substrates, for example. FIG. 7 shows that the current density near the wafer substrate edge is about 600% higher than near the wafer substrate center, even while using settings for the auxiliary cathode and secondary auxiliary cathode elements which shape the current distribution and reduce edge current. As a uniform current density may be needed across the wafer substrate during initial plating when small features are to be filled by the copper which is being electrodeposited, this plating cell configuration would not be used in such processes. Such a plating cell configuration, however, can generate a uniform profile on thick copper films.

Figure 8:
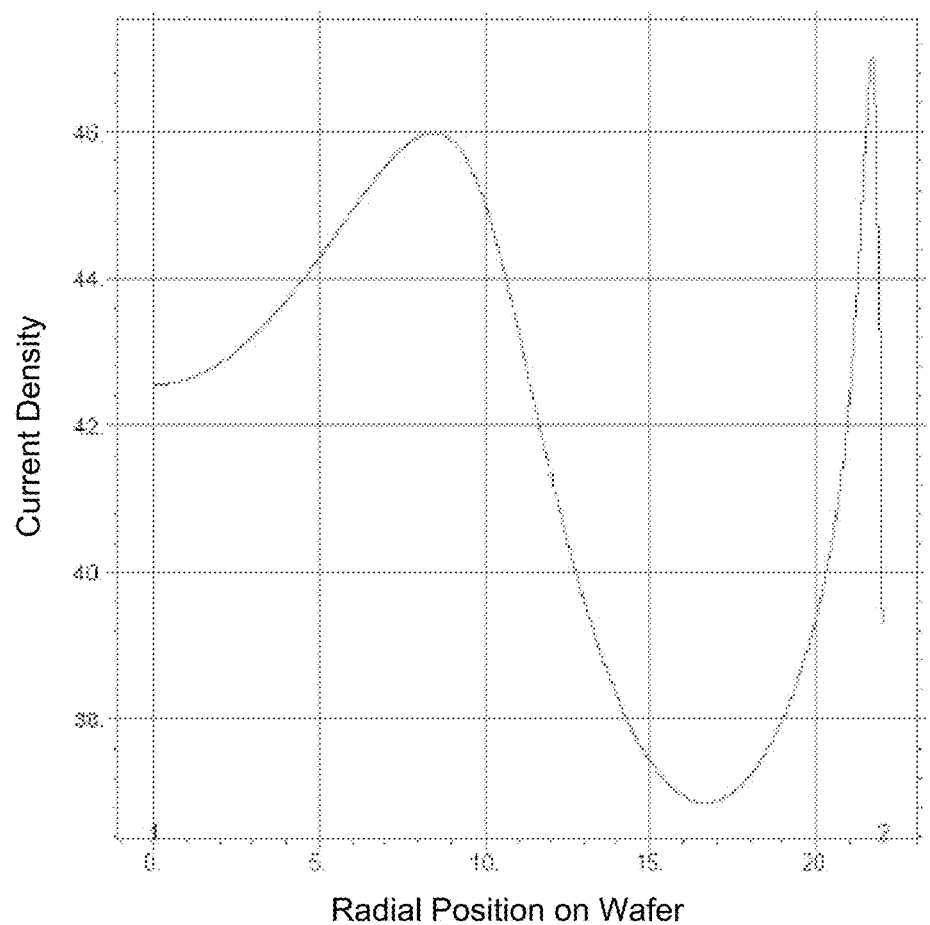

An example of a current distribution generated using the disclosed apparatus having a movable anode chamber, with the movable anode chamber being at its upper position, is shown in FIG. 8. For this model, the anode chamber opening was 210 mm. At the 105 mm radial position, an insulating shield extended upward about 14 mm toward a HRVA plate. From that position, the insulating shield extended outward to a position about 4 mm below the outer perimeter of the HRVA plate. The HRVA plate was 1.17% porous, had an outer opening diameter of 223.5 mm, and was 5 mm below the wafer substrate.

Starting at the wafer substrate center, the initial current density increased due to the terminal effect across the inner 85 mm radius of the wafer substrate above the anode chamber. Current density out to a radial position about 170 mm from the wafer substrate center dropped, however, due to the shielding effect of the sloped insulating shield. At radii from about 170 mm to 215 mm, the current density increased due to the much stronger terminal effect at the outer portion of the wafer substrate where a higher current flow across the seed layer is required. Beyond 215 mm, the secondary auxiliary cathode effectively reduced the current density. The overall current distribution varied by about 25%, better than the 600% variation typical with existing hardware scaled to 450 mm wafer substrate use (see FIG. 7). As noted above, parameters such as the insulating shield opening diameter, the slope of the insulating shield, the distance between the insulating shield and the HRVA plate, the distance between the HRVA plate and the wafer substrate, the HRVA plate percent open area or thickness, and the secondary auxiliary cathode strength can be used to adjust the current distribution when plating begins on a thin resistive seed layer.

Figure 9:
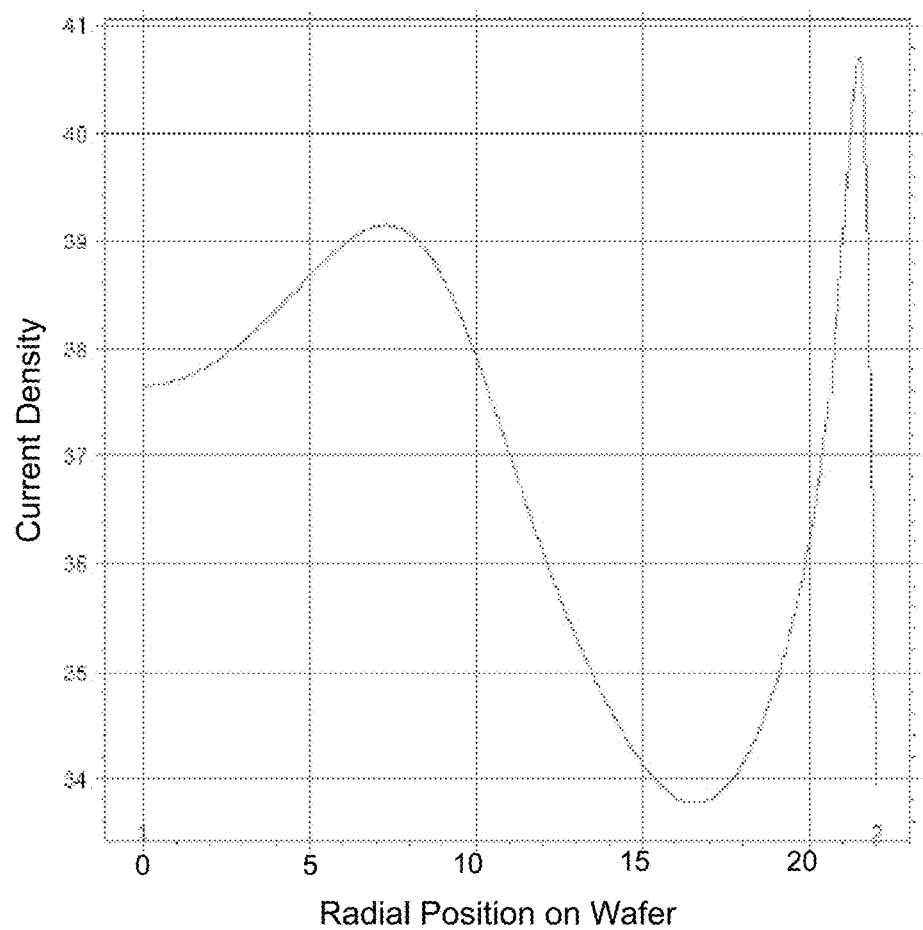

An example of a current distribution generated using another configuration of the disclosed apparatus having a movable anode chamber, with the movable anode chamber being at its upper position, is shown in FIG. 9. For this model, the spacing between the outer part of the HRVA plate and the outer part of the anode chamber was increased to 8 mm, which allowed for a membrane and solution entry point to be positioned between the HRVA plate and the anode chamber. A more complex shape of the insulating shield was also used. As shown in FIG. 9, the overall current distribution varied by about 21%.

Figure 10:
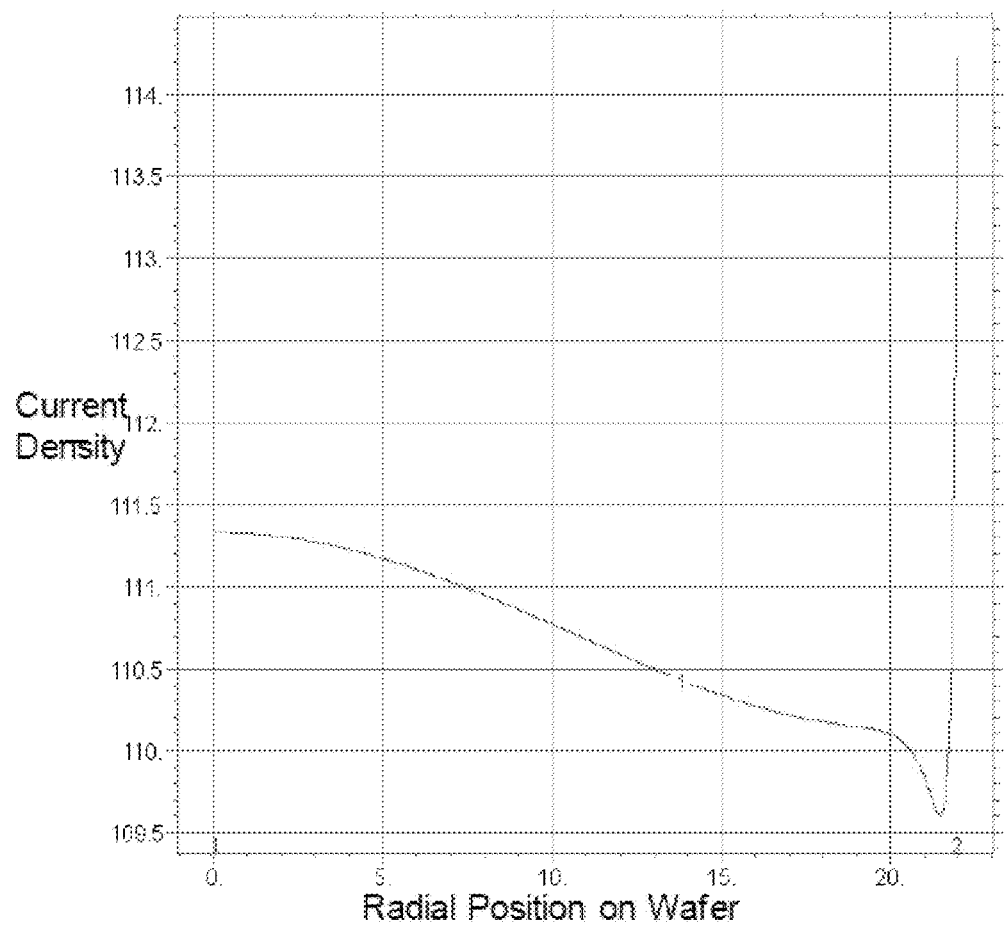

As described above, after copper is plated onto the seed layer and the terminal effect becomes less pronounced, the movable anode chamber may be moved to a lower position to generate a uniform current distribution across the face of the wafer substrate. FIG. 10 shows an example a current distribution generated using a model in which the anode chamber was in a lower position (e.g., about 20 cm from its upper position) and the copper layer on the wafer substrate was 0.4 micrometers thick. As shown, the overall current distribution varied about varied by about 3%.

Thus, as these numerical simulations illustrate, a movable anode chamber may be used (in combination with other techniques) to effectively mitigate the terminal effect. Further, after a metal is plated onto a thin resistive seed layer, a movable anode chamber, positioned such that current flow to the wafer substrate edge is not impeded, may still provide a uniform current density across the face of a wafer substrate.

Further Implementations

The apparatus/methods described hereinabove also may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step enabled with a number of possible tools: (1) application of photoresist on a work piece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the photoresist so as to selectively remove photoresist and thereby pattern it using a tool such as a wet bench; (5) transferring the photoresist pattern into an underlying film or work piece by using a dry or plasma-assisted etching tool; and (6) removing the photoresist using a tool such as an RF or microwave plasma resist stripper.

It is understood that the examples and implementations described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosed implementations are not to be limited to the details given herein, but may be modified within the scope of the appended claims. Further it is understood that many features presented in this application can be practiced separately as well as in any suitable combination with each other, as will be understood by one of ordinary skill in the art.

What is claimed is:

1. A method comprising:
(a) holding a substrate having a conductive seed and/or barrier layer disposed on its surface in a substrate holder of an apparatus, the apparatus including a plating chamber, a shield, and an anode chamber housing an anode, the plating chamber containing the anode chamber, the shield oriented between the anode and an ionically resistive ionically permeable element, wherein the shield comprises an opening in a central region of the shield, wherein the shield includes an outer perimeter and an inner perimeter, the inner perimeter of the shield defining the opening, and wherein a surface of the shield includes a slope such that the outer perimeter is closer to the ionically resistive ionically permeable element than the inner perimeter;
(b) immersing the surface of the substrate in an electrolyte solution and proximate the ionically resistive ionically permeable element positioned between the surface and the anode chamber, the ionically resistive ionically permeable element having a flat surface that is parallel to and separated from the surface of the substrate;
(c) supplying current to the substrate to plate a metal layer onto the seed and/or barrier layer; and
(d) supplying current to an auxiliary cathode located between the anode and the ionically resistive ionically permeable element to thereby shape a current distribution from the anode.

2. The method of claim 1, further comprising supplying current to a secondary auxiliary cathode located in substantially the same plane as the substrate and thereby diverting a portion of ionic current from an edge region of the substrate.

3. The method of claim 1, further comprising
moving the shield from a first position to a second position, the second position being located
a distance further away from the ionically resistive ionically permeable element than the first
position, and dynamically controlling the position of the shield during plating to account for a
reduction of a voltage decrease from an edge to a center of the surface of the substrate.

4. The method of claim 1, wherein the plating chamber further includes a cationic membrane separating the plating chamber into an anolyte chamber and a catholyte chamber, wherein the anode resides in the anolyte chamber.

5. The method of claim 1, wherein an area of the opening in the shield is about 15% to 80% of an area of the surface of the substrate.

6. The method of claim 1, further comprising moving the shield from a first position to a second position, the second position being located a distance further away from the ionically resistive ionically permeable element than the first position, wherein a sheet resistance of the substrate having a conductive seed and/or barrier is about 50 Ohms per square to 5 Ohms per square when the shield is in the first position.

7. The method of claim 1, further comprising
moving the shield from a first position to a second position, the second position being located
a distance further away from the ionically resistive ionically permeable element than the first
position, wherein the shield moves from the first position to the second position in a period of time.

8. The method of claim 1, further comprising:
applying photoresist to the substrate;
exposing the photoresist to light;
patterning the photoresist and transferring the pattern to the substrate; and
selectively removing the photoresist from the substrate.

9. The method of claim 1, wherein the ionically resistive ionically permeable element has a plurality of non-communicating perforations and wherein ions in the electrolyte solution pass through the perforations.

10. The method of claim 1, wherein the auxiliary cathode is a virtual auxiliary cathode having an associated physical cathode housed in a cavity in the plating chamber, wherein the cavity is in ionic communication with the plating chamber.

11. The method of claim 1, further comprising dynamically controlling an amount of current supplied to the auxiliary cathode during plating to account for a reduction of non-uniform current distribution at the surface of the substrate.

12. The method of claim 1, wherein when current is initially supplied to the auxiliary cathode in (d), a ratio of current supplied to the auxiliary cathode and to the substrate is at least about 4:1.

13. The method of claim 1, wherein a maximum current supplied to the auxiliary cathode during electroplating is between about 5 to 40 Amps.

14. The method of claim 2, wherein a maximum current supplied to the secondary auxiliary cathode during electroplating is between about 5 to 25 Amps.

15. The method of claim 2, wherein a ratio of current supplied to the auxiliary cathode and the secondary auxiliary cathode during electroplating ranges between about 2:1 and 10:1.

16. The method of claim 9, wherein substantially all perforations have a principal dimension or a diameter no greater than about 5 millimeters, wherein the principal dimension or diameter is measured on a side of the ionically resistive ionically permeable element that faces the surface of the substrate.

17. The method of claim 11, wherein no current or substantially no current is supplied to the auxiliary cathode after:
- (i) a sheet resistance of the substrate surface reaches about 2 to 5 ohm/square or less,
- (ii) at least about 100 to 250 angstroms of metal are plated during (c) or
- (iii) metal is plated during (c) for a period of about 2 to 6 seconds or less.

* * * * *